United States Patent
Kodama et al.

(10) Patent No.: US 12,191,153 B2
(45) Date of Patent: Jan. 7, 2025

(54) SUBSTRATE PROCESSING APPARATUS, SUBSTRATE PROCESSING SYSTEM AND SUBSTRATE PROCESSING METHOD

(71) Applicant: Tokyo Electron Limited, Tokyo (JP)

(72) Inventors: Munehisa Kodama, Kumamoto (JP); Tomohiro Kaneko, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 533 days.

(21) Appl. No.: 17/627,147

(22) PCT Filed: Jul. 8, 2020

(86) PCT No.: PCT/JP2020/026624
§ 371 (c)(1),
(2) Date: Jan. 14, 2022

(87) PCT Pub. No.: WO2021/010236
PCT Pub. Date: Jan. 21, 2021

(65) Prior Publication Data
US 2022/0277962 A1    Sep. 1, 2022

(30) Foreign Application Priority Data

Jul. 17, 2019    (JP) .................................. 2019-132256

(51) Int. Cl.
*H01L 21/306* (2006.01)
*H01L 21/02* (2006.01)
(Continued)

(52) U.S. Cl.
CPC .. *H01L 21/30604* (2013.01); *H01L 21/02057* (2013.01); *H01L 21/67023* (2013.01); *H01L 21/6708* (2013.01); *H01L 21/68764* (2013.01)

(58) Field of Classification Search
CPC ......... H01L 21/30604; H01L 21/02057; H01L 21/67023; H01L 21/6708; H01L 21/68764;
(Continued)

(56) References Cited

U.S. PATENT DOCUMENTS 5,329,732 A  *  7/1994  Karlsrud ..........  G05B 19/41825
451/334
6,050,880 A  *  4/2000  Kato .......................  B24B 7/228
451/388

(Continued)

FOREIGN PATENT DOCUMENTS

JP    2008-264913 A    11/2008

OTHER PUBLICATIONS

International Search Report of PCT/JP2020/026624 dated Aug. 11, 2020.

*Primary Examiner* — Duy Vu N Deo
*Assistant Examiner* — Christopher Remavege
(74) *Attorney, Agent, or Firm* — Shih IP Law Group, PLLC.

(57) ABSTRACT

A substrate processing apparatus includes a pair of first substrate chucks each configured to hold a substrate from below while allowing a first main surface of the substrate to face upwards; a pair of second substrate chucks each configured to hold the substrate from below while allowing a second main surface of the substrate opposite to the first main surface to face upwards; a rotary table which is configured to be rotated about a rotation axis; a first processing unit equipped with a first processing tool configured to process the first main surface of the substrate held by the first substrate chuck; and a second processing unit equipped (Continued)

with a second processing tool configured to process the second main surface of the substrate held by the second substrate chuck.

18 Claims, 16 Drawing Sheets

(51) Int. Cl.
  *H01L 21/67* (2006.01)
  *H01L 21/687* (2006.01)
(58) Field of Classification Search
  CPC ......... H01L 21/02008; H01L 21/67173; H01L 21/67178; H01L 21/67219; H01L 21/67259; H01L 21/68771; H01L 21/304; H01L 21/67092; B23Q 1/64; B23Q 1/66; B23Q 3/02; B23Q 3/08; B24B 7/00; B24B 41/06; B24B 49/12; B24B 7/228; B24B 7/06; B24B 27/0023; B24B 27/0069; B24B 27/0076; B24B 47/12; B24B 47/22; B24B 55/06
  See application file for complete search history.

(56) References Cited

U.S. PATENT DOCUMENTS

| | | | | |
|---|---|---|---|---|
| 6,183,345 | B1* | 2/2001 | Kamono | B24B 37/013 451/6 |
| 6,358,128 | B1* | 3/2002 | Sakurai | B24B 37/345 451/287 |
| 6,629,883 | B2* | 10/2003 | Katsuoka | H01L 21/67745 451/41 |
| 6,752,701 | B1* | 6/2004 | Honda | H01L 21/6708 451/41 |
| 8,025,556 | B2* | 9/2011 | Kajiyama | B24B 27/0076 451/41 |
| 2002/0160691 | A1* | 10/2002 | Ishikawa | B24B 49/04 451/8 |
| 2004/0216842 | A1* | 11/2004 | Jeong | B24B 37/042 156/345.11 |
| 2005/0118938 | A1* | 6/2005 | Mizomoto | B24B 37/345 451/65 |
| 2006/0182538 | A1* | 8/2006 | Lee | H01L 21/67167 414/217 |
| 2009/0011572 | A1* | 1/2009 | Kaneko | B23K 26/0853 134/1.2 |
| 2009/0061739 | A1* | 3/2009 | Jeong | B24B 37/345 451/103 |
| 2009/0186562 | A1* | 7/2009 | Kajiyama | B24B 37/042 451/57 |
| 2014/0073224 | A1* | 3/2014 | Yamashita | B24B 7/228 219/121.68 |
| 2014/0102474 | A1* | 4/2014 | Takiguchi | B08B 3/02 134/99.1 |
| 2016/0314996 | A1* | 10/2016 | Kim | H01L 21/67051 |
| 2017/0032510 | A1* | 2/2017 | Francken | G06T 7/0004 |
| 2020/0316750 | A1* | 10/2020 | Matsubara | B24B 5/50 |

* cited by examiner

SUBSTRATE PROCESSING APPARATUS, SUBSTRATE PROCESSING SYSTEM AND SUBSTRATE PROCESSING METHOD

CROSS-REFERENCE TO RELATED APPLICATIONS

This Application is a U.S. national phase application under 35 U.S.C. § 371 of PCT Application No. PCT/JP2020/026624 filed on Jul. 8, 2020, which claims the benefit of Japanese Patent Application No. 2019-132256 filed on Jul. 17, 2019, the entire disclosures of which are incorporated herein by reference.

TECHNICAL FIELD

The various aspects and embodiments described herein pertain generally to a substrate processing apparatus, a substrate processing system, and a substrate processing method.

BACKGROUND

A grinding apparatus of Patent Document 1 includes a rotary table and a plurality of substrate chucks arranged around a rotation center line of the rotary table at a regular distance therebetween. The plurality of substrate chucks are revolved about the rotation center line of the rotary table along with the rotary table. The rotary table sequentially sends each of the plurality of substrate chucks to a holding/releasing position where holding and releasing of the holding of a substrate are performed, a first grinding position where a first grinding of the substrate is performed, and a second grinding position where a second grinding of the substrate is performed.

PRIOR ART DOCUMENT

Patent Document 1: Japanese Patent Laid-open Publication No. 2008-264913

DISCLOSURE OF THE INVENTION

Problems to be Solved by the Invention

Exemplary embodiments provide a technique enabling to perform both a processing of a first main surface of a substrate and a processing of a second main surface of the substrate opposite to the first main surface on a single rotary table.

Means for Solving the Problems

In an exemplary embodiment, a substrate processing apparatus includes a pair of first substrate chucks each configured to hold a substrate from below while allowing a first main surface of the substrate to face upwards; a pair of second substrate chucks each configured to hold the substrate from below while allowing a second main surface of the substrate opposite to the first main surface to face upwards; a rotary table which holds, around a vertical rotation axis thereof, a first one of the pair of first substrate chucks, a first one of the pair of second substrate chucks, a second one of the pair of first substrate chucks, and a second one of the pair of second substrate chucks in this sequence at a regular distance therebetween, and which is configured to be rotated about the rotation axis; a first processing unit equipped with a first processing tool configured to process the first main surface of the substrate held by the first substrate chuck; and a second processing unit equipped with a second processing tool configured to process the second main surface of the substrate held by the second substrate chuck.

Effect of the Invention

According to the exemplary embodiments, it is possible to perform both a processing of a first main surface of a substrate and a processing of a second main surface of the substrate opposite to the first main surface on a single rotary table.

DETAILED DESCRIPTION

Figure 1:
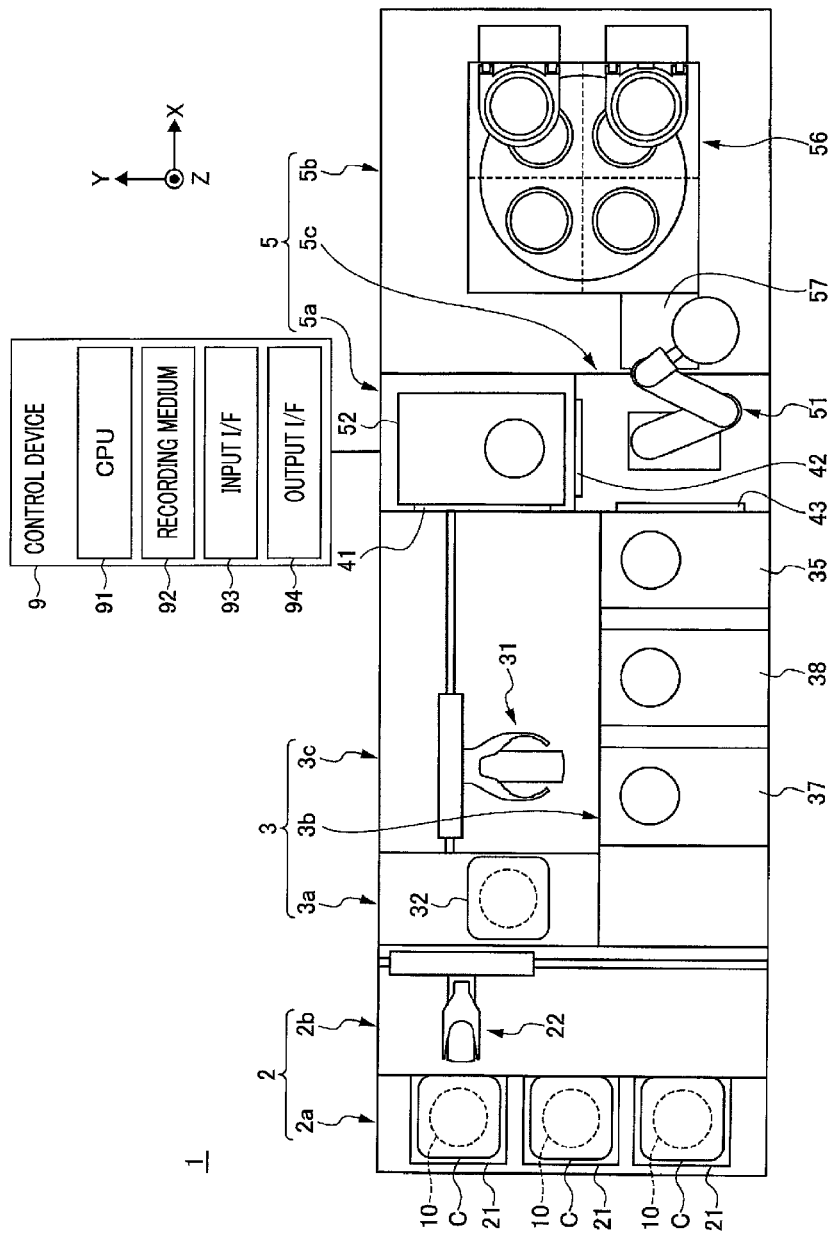
FIG. 1 is a plan view illustrating a substrate processing system according to an exemplary embodiment.

Hereinafter, exemplary embodiments of the present disclosure will be described with reference to the accompanying drawings. In the various drawings, same or corresponding parts will be assigned same or corresponding reference numerals, and redundant description will be omitted. In the present specification, the X-axis direction, the Y-axis direction, and the Z-axis direction are directions perpendicular to each other. The X-axis and Y-axis directions are horizontal directions, and the Z-axis direction is a vertical direction.

Figure 2:
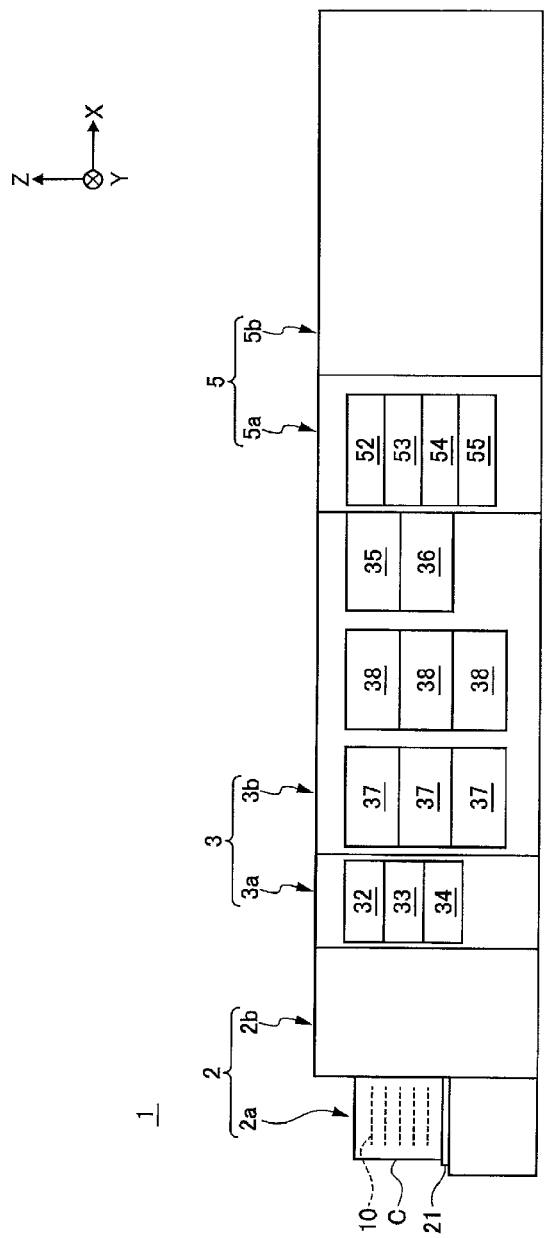
FIG. 2 is a side view illustrating the substrate processing system of FIG. 1.

FIG. 1 is a plan view illustrating a substrate processing system according to an exemplary embodiment. FIG. 2 is a side view illustrating an example of the substrate processing system of FIG. 1. In FIG. 2, in order to illustrate various apparatuses disposed in a third processing block 5a of a second processing station 5 of FIG. 1, illustration of a third transfer block 5c will be omitted.

Figure 3:
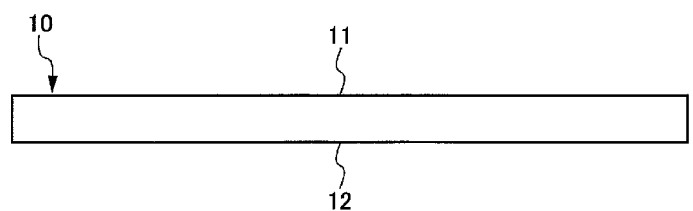
FIG. 3 is a side view illustrating an example of a substrate.

A substrate processing system 1 is configured to grind and planarize a substrate 10. The substrate 10 is, for example, a semiconductor substrate such as a silicon wafer. For example, the substrate 10 is prepared by slicing an ingot. As shown in FIG. 3, the substrate 10 has a first main surface 11 and a second main surface 12 opposite to the first main surface 11.

The first main surface 11 and the second main surface 12 are distinguished by using, for example, a mark formed on the substrate 10 in advance. Further, the first main surface 11 and the second main surface 12 may be defined as a top surface and a bottom surface of the substrate 10 before being processed when it is accommodated in a cassette C. The top surface may be the first main surface 11 and the bottom surface may be the second main surface 12, or vice versa.

The substrate processing system 1 grinds both the first main surface 11 and the second main surface 12 of the substrate 10. By way of example, the substrate processing system 1 grinds the first main surface 11 of the substrate 10, and grinds the second main surface 12 opposite to the first main surface 11 which has been ground.

The substrate processing system 1 includes, as illustrated in FIG. 1, a carry-in/out station 2, a first processing station 3, a second processing station 5, and a control device 9. The carry-in/out station 2, the first processing station 3, and the second processing station 5 are arranged in this order from the negative X-axis side to the positive X-axis side.

The carry-in/out station 2 has a carry-in/out block 2a and a first transfer block 2b. The first transfer block 2b is disposed next to the carry-in/out block 2a, for example, on the positive X-axis side of the carry-in/out block 2a. Further, the first transfer block 2b is disposed next to a first processing block 3a of the first processing station 3, for example, on the negative X-axis side of the first processing block 3a.

The carry-in/out block 2a includes a plurality of placing units 21 arranged in a row in the Y-axis direction. A cassette C is disposed in each of the plurality of placing units 21. The cassette C accommodates therein a plurality of substrates 10 at a regular distance therebetween in a vertical direction. In addition, the number of the placing units 21 is not particularly limited. Likewise, the number of the cassettes C is not particularly limited, either.

A first transfer device 22 is provided in the first transfer block 2b. The first transfer device 22 has a holder configured to hold the substrate 10. The holder is configured to be movable in horizontal directions (both in the X-axis direction and the Y-axis direction) and in a vertical direction and pivotable around a vertical axis. The first transfer device 22 transfers the substrates 10 to/from the plurality of cassettes C disposed in the plurality of placing units 21 and the first processing block 3a of the first processing station 3.

The first processing station 3 includes the first processing block 3a, a second processing block 3b, and a second transfer block 3c. The second transfer block 3c is disposed next to the first processing block 3a and the second processing block 3b, for example, on the positive X-axis side of the first processing block 3a and on the positive Y-axis side of the second processing block 3b. Further, the second transfer block 3c is disposed next to the third processing block 5a of the second processing station 5 and, for example, on the negative X-axis side of the third processing block 5a.

A second transfer device 31 is disposed in the second transfer block 3c. The second transfer device 31 has a holder configured to hold the substrate 10. The holder is configured to be movable in the horizontal directions (both in the X-axis direction and the Y-axis direction) and in the vertical direction and pivotable around a vertical axis. The second transfer device 31 is configured to transfer the substrates 10 to/from the first processing block 3a, the second processing block 3b, and the third processing block 5a of the second processing station 5.

The first processing block 3a includes, for example, a first transition device 32, a second transition device 33, and a first inverting device 34, as shown in FIG. 2. The first transition device 32 is configured to receive the substrate 10 from the first transfer device 22 and temporarily store therein the substrate 10 until the substrate 10 is handed over to the second transfer device 31 later. The second transition device 33 is configured to receive the substrate 10 from the second transfer device 31 and temporarily store therein the substrate 10 until the substrate 10 is handed over to the first transfer device 22 later. The first inverting device 34 is configured to invert the substrate 10 upside down after the second main surface 12 of the substrate 10 is etched and before the first main surface 11 of the substrate 10 is etched. Here, the layout and the number of the various devices constituting the first processing block 3a are not limited to the example shown in FIG. 2.

The second processing block 3b has, for example, a first cleaning apparatus 35, a second cleaning apparatus 36, a first etching apparatus 37, and a second etching apparatus 38, as illustrated in FIG. 2. The first cleaning apparatus 35 is configured to clean the substrate 10 after the grinding of the first main surface 11 of the substrate 10 and wash away foreign substances attached to the substrate 10 with a brush or a sponge. The second cleaning apparatus 36 is configured to clean the substrate 10 after the grinding of the second main surface 12 of the substrate 10 and wash away foreign substances attached to the substrate 10 with a brush or a sponge. The first etching apparatus 37 is configured to etch the first main surface 11 of the substrate 10 after the grinding of the first main surface 11, thus removing a damage layer formed by the grinding of the first main surface 11 or planarizing the first main surface 11. The second etching apparatus 38 is configured to etch the second main surface 12 of the substrate 10 after the grinding of the second main surface 12, thus removing a damage layer formed by the grinding of the second main surface 12 or planarizing the second main surface 12. Here, the layout and the number of the various apparatuses constituting the second processing block 3b are not limited to the example shown in FIG. 2.

The second processing station 5 includes a third processing block 5a, a fourth processing block 5b, and a third transfer block 5c. The third transfer block 5c is disposed next to the third processing block 5a and the fourth processing block 5b, for example, on the negative Y-axis side of the third processing block 5a and on the negative X-axis side of the fourth processing block 5b. Further, the third transfer block 5c and the third processing block 5a may be one and the same block. The third transfer block 5c is disposed next to the second processing block 3b of the first processing station 3, for example, on the positive X-axis side of the second processing block 3b.

A third transfer device 51 is disposed in the third transfer block 5c. The third transfer device 51 has a holder configured to hold the substrate 10. The holder is configured to be movable in the horizontal directions (both in the X-axis direction and the Y-axis direction) and in the vertical direction and pivotable around a vertical axis. The third transfer device 51 is configured to transfer the substrate 10 to/from the third processing block 5a, the fourth processing block 5b, and the second processing block 3b of the first processing station 3.

The third processing block 5a includes, for example, a first alignment device 52, a second alignment device 53, a second inverting device 54, and a buffer device 55, as shown in FIG. 2. The first alignment device 52 is configured to detect a center position of the first main surface 11 with a camera or the like in the state that the first main surface 11 of the substrate 10 faces upwards. When the substrate 10 is placed on a substrate chuck of a substrate processing apparatus 56 with the first main surface 11 of the substrate 10 facing upwards, a center of the substrate 10 and a center of the substrate chuck can be aligned. The second alignment device 53 is configured to detect a center position of the second main surface 12 with a camera or the like in the state that the second main surface 12 of the substrate 10 faces upwards. When the substrate 10 is placed on the substrate chuck of the substrate processing apparatus 56 with the second main surface 12 of the substrate 10 facing upwards, the center of the substrate 10 and the center of the substrate chuck can be aligned. The second inverting device 54 is configured to invert the substrate 10 upside down before the second main surface 12 of the substrate 10 is ground and after the first main surface 11 of the substrate 10 is ground.

The buffer device 55 is configured to store therein the substrate 10 after being cleaned by the first cleaning apparatus 35 and before being returned to the substrate processing apparatus 56. The substrate 10 may temporarily stand by in the buffer device 55 after the grinding of the first main surface 11 and before the grinding of the second main surface 12, depending on a time difference between a plurality of processing times such as a grinding time and a cleaning time. Since the substrate 10 before being returned to the substrate processing apparatus 56 is temporarily stored, a fluctuation in a tact time of the substrate processing apparatus 56 can be absorbed, and an operating rate of the substrate processing apparatus 56 can be improved. In addition, since the substrate 10 is stored after it is cleaned, the buffer device 55 may be kept clean, as compared to a case where the substrate 10 before being cleaned is stored therein.

The buffer device 55 is provided at a portion of a transfer path of the substrate 10 which is transferred from the first cleaning apparatus 35 to the second alignment device 53 via the second inverting device 54. That is, the buffer device 55 is provided on either a transfer path from the first cleaning apparatus 35 to the second inverting device 54 or a transfer path from the second inverting device 54 to the second alignment device 53. In any case, even if misalignment of the substrate 10 occurs in the buffer device 55, the second alignment device 53 detects the center of the second main surface 12 of the substrate 10 later, so that the center of the substrate 10 and the center of the substrate chuck can still be aligned.

In addition, the layout and the number of the various devices constituting the third processing block 5a are not limited to the example shown in FIG. 2. By way of example, the second inverting device 54 and the buffer device 55 may be disposed in the first processing block 3a of the first processing station 3.

The fourth processing block 5b is equipped with, for example, the substrate processing apparatus 56 and a cleaning apparatus 57, as illustrated in FIG. 1. The substrate processing apparatus 56 is configured to grind and planarize the substrate 10. The substrate processing apparatus 56 grinds both the first main surface 11 of the substrate 10 and the second main surface 12 of the substrate 10. Details of the substrate processing apparatus 56 will be described later.

The cleaning apparatus 57 is configured to clean the bottom surface of the substrate 10 while holding the substrate 10 processed by the substrate processing apparatus 56 from above with the holder of the third transfer device 51.

A transfer opening for the substrate 10 is provided at a boundary between the third processing block 5a and the second transfer block 3c, and this transfer opening is opened or closed by a shutter 41. The shutter 41 opens the transfer opening immediately before the second transfer device 31 enters the third processing block 5a from the second transfer block 3c, and closes the transfer opening immediately after the second transfer device 31 exits the third processing block 5a into the second transfer block 3c. Thus, particles generated in the substrate processing apparatus 56 can be suppressed from reaching the second transfer block 3c via the third transfer block 5c and the third processing block 5a, so that the second transfer block 3c can be maintained clean.

Likewise, a transfer opening for the substrate 10 is provided at a boundary between the third processing block 5a and the third transfer block 5c, and this transfer opening is opened or closed by a shutter 42. The shutter 42 opens the transfer opening immediately before the third transfer device 51 enters the third processing block 5a from the third transfer block 5c, and closes the transfer opening immediately after the third transfer device 51 exits the third processing block 5a into the third transfer block 5c. Thus, particles generated in the substrate processing apparatus 56 can be suppressed from entering the third processing block 5a via the third transfer block 5c, so that the third processing block 5a can be maintained clean.

Likewise, a transfer opening for the substrate 10 is provided at a boundary between the second processing block 3b and the third transfer block 5c, and this transfer opening is opened or closed by a shutter 43. The shutter 43 opens the transfer opening immediately before the third transfer device 51 enters the second processing block 3b from the third transfer block 5c, and closes the transfer opening immediately after the third transfer device 51 exits the second processing block 3b into the third transfer block 5c. Therefore, particles generated in the substrate processing apparatus 56 can be suppressed from entering the second processing block 3b via the third transfer block 5c, so that the second processing block 3b can be maintained clean.

The control device 9 is, for example, a computer, and includes a central processing unit (CPU) 91 and a recording medium 92 such as a memory, as illustrated in FIG. 1. The recording medium 92 stores therein a program for controlling various processings performed in the substrate processing system 1. The control device 9 controls an operation of the substrate processing system 1 by allowing the CPU 91 to execute the program stored in the recording medium 92. Further, the control device 9 is equipped with an input interface 93 and an output interface 94. The control device 9 receives a signal from the outside through the input interface 93 and transmits a signal to the outside through the output interface 94.

The program is stored in, for example, a computer-readable recording medium, and installed from this recording medium to the recording medium 92 of the control device 9. The computer-readable recording medium may be, by way of non-limiting example, a hard disk HD, a flexible disk FD, a compact disk CD, a magnet optical disk MO, or a memory card. Further, the program may be downloaded from a server through the Internet and installed in the recording medium 92 of the control device 9.

Figure 4:
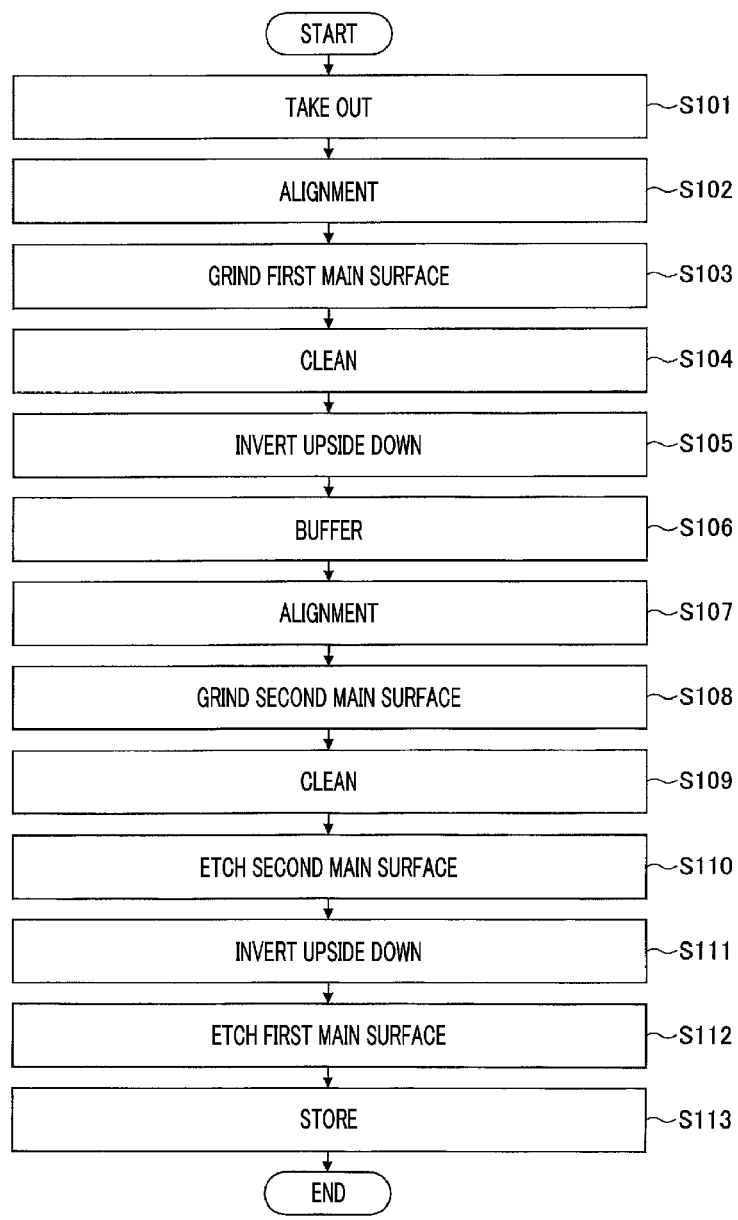
FIG. 4 is a flowchart illustrating a substrate processing method according to the exemplary embodiment.

The operation of the substrate processing system 1 having the above configuration will be described with reference to FIG. 4. Processings shown in FIG. 4 are performed under control of the control device 9.

First, the first transfer device 22 takes out the substrate 10 from the cassette C placed in the placing unit 21 (S101). Then, the first transition device 32 receives the substrate 10 from the first transfer device 22 and hands it over to the second transfer device 31. The second transfer device 31 transfers the substrate 10 from the first transition device 32 to the first alignment device 52.

Subsequently, in the state that the first main surface 11 of the substrate 10 faces upwards, the first alignment device 52 detects the center position of the first main surface 11 with the camera or the like (S102). Then, the third transfer device 51 transfers the substrate 10 from the first alignment device 52 to the substrate processing apparatus 56. The control device 9 controls the third transfer device 51 based on the detection result of the first alignment device 52 so that the center of the substrate 10 coincides with the center of the substrate chuck of the substrate processing apparatus 56.

Thereafter, the substrate processing apparatus 56 grinds the first main surface 11 of the substrate 10 (S103). Then, the third transfer device 51 transfers the substrate 10 from the substrate processing apparatus 56 to the first cleaning apparatus 35. Further, the cleaning apparatus 57 may clean the bottom surface (second main surface 12) of the substrate 10 on the way. In the meanwhile, the top surface (first main surface 11) of the substrate 10 is held by the holder of the third transfer device 51. Since the cleaning device 57 cleans the bottom surface of the substrate 10 during the transfer of the substrate 10, it is possible to suppress grinding debris from being carried out of the fourth processing block 5b.

Subsequently, the first cleaning apparatus 35 cleans the substrate 10 (S104). Foreign substances attached to the substrate 10 are washed away with the brush, the sponge, or the like. Both the top and bottom surfaces of the substrate 10 may be scrub-cleaned. Then, the second transfer device 31 transfers the substrate 10 from the first cleaning apparatus 35 to the second inverting device 54.

Afterwards, the second inverting device 54 inverts the substrate 10 upside down, allowing the second main surface 12 of the substrate 10 to face upwards (S105). Then, the second transfer device 31 transfers the substrate 10 from the second inverting device 54 to the buffer device 55.

Thereafter, the buffer device 55 temporarily stores therein the substrate 10 (S106). Then, the second transfer device 31 transfers the substrate 10 from the buffer device 55 to the second alignment device 53. Here, the vertical inversion (S105) of the substrate 10 and the temporary storage (S106) of the substrate 10 may be performed in the reverse order. In such a case, the second transfer device 31 transfers the substrate 10 from the first cleaning apparatus 35 to the buffer device 55, then from the buffer device 55 to the second inverting device 54, and then from the second inverting device 54 to the second alignment device 53.

Further, although the temporary storage in the buffer device 55 (S106) is performed after the grinding of the first main surface 11 (S103) and before grinding of the second main surface 12 (S108) in FIG. 4, the temporary storage in the buffer device (S106) may not be performed depending on the operational status of the substrate processing apparatus 56. That is, the substrate 10 may not pass through the buffer device 55 after the grinding of the first main surface 11 (S103) and before the grinding of the second main surface 12 (S108).

Then, in the state that the second main surface 12 of the substrate 10 faces upwards, the second alignment device 53 detects the center position of the second main surface 12 with the camera or the like (S107). Then, the third transfer device 51 transfers the substrate 10 from the second alignment device 53 to the substrate processing apparatus 56. The control device 9 controls the third transfer device 51 based on the detection result of the second alignment device 53 so that the center of the substrate 10 coincides with the center of the substrate chuck of the substrate processing apparatus 56.

Subsequently, the substrate processing apparatus 56 grinds the second main surface 12 of the substrate 10 (S108). Then, the third transfer device 51 transfers the substrate 10 from the substrate processing apparatus 56 to the second cleaning apparatus 36. Further, the cleaning apparatus 57 may clean the bottom surface (first main surface 11) of the substrate 10 on the way. In the meanwhile, the top surface (second main surface 12) of the substrate 10 is held by the holder of the third transfer device 51. Since the cleaning apparatus 57 cleans the bottom surface of the substrate 10 during the transfer of the substrate 10, it is possible to suppress grinding debris from being carried out of the fourth processing block 5b.

Next, the second cleaning apparatus 36 cleans the substrate 10 (S109). Foreign substances adhering to the substrate 10 are washed away with the brush, the sponge, or the like. Both the top and bottom surfaces of the substrate 10 may be scrub-cleaned. Thereafter, the second transfer device 31 transfers the substrate 10 from the second cleaning apparatus 36 to the second etching apparatus 38.

Next, the second etching apparatus 38 etches the second main surface 12 of the substrate 10 (S110). The second etching apparatus 38 discharges an etching liquid from above the substrate 10 being rotated, for example, and etches the second main surface 12 with the etching liquid. A damage layer formed by the grinding of the second main surface 12 may be removed. In addition to the removal of the damage layer, planarization may also be achieved. Then, the second transfer device 31 transfers the substrate 10 from the second etching apparatus 38 to the first inverting device 34.

Subsequently, the first inverting device 34 inverts the substrate 10 upside down, allowing the first main surface 11 of the substrate 10 to face upwards (S111). Thereafter, the second transfer device 31 transfers the substrate 10 from the first inverting device 34 to the first etching apparatus 37.

Then, the first etching apparatus 37 etches the first main surface 11 of the substrate 10 (S112). The first etching apparatus 37 discharges the etching liquid from above the substrate 10 being rotated, for example, and etches the first main surface 11 with the etching liquid. A damage layer formed by the grinding of the first main surface 11 may be removed. In addition to the removal of the damage layer, planarization may be achieved as well. Thereafter, the second transfer device 31 transfers the substrate 10 from the first etching apparatus 37 to the second transition device 33.

Finally, the first transfer device 22 receives the substrate 10 from the second transition device 33 and puts the substrate 10 in the cassette C placed in the placing unit 21 (S113). The substrate 10 is transferred to the outside while being accommodated in the cassette C.

Immediately after the substrate 10 is cut off from the ingot, neither thickness nor flatness of the substrate 10 is uniform. The thickness and the flatness are not uniform even within one substrate 10, and not uniform between a plurality of substrates 10 as well. According to the present exemplary embodiment, since both surfaces (the first main surface 11 and the second main surface 12) of the substrate 10 can be ground, the thickness and the flatness of the substrate 10 can be uniformed.

According to the present exemplary embodiment, since both surfaces of the substrate 10 are ground in one system 1, products can be mass-produced in this single system 1. Therefore, non-uniformity in quality between the products can be reduced, so that it becomes easy to manage the quality of the products. Further, since the cleaning and the etching of both surfaces as well as the grinding of both surfaces are performed in the single system 1, it becomes easier to manage the quality of the products.

Furthermore, according to the present exemplary embodiment, since both surfaces of the substrate 10 are ground in the single system 1, the whole system can be scaled down as compared to a case where one surface of the substrate is ground in one system and the other surface of the substrate is ground in another system. This is because the carry-in/out station 2 and the transfer paths of the substrate 10 are shared. In addition, since not only the grinding of both surfaces but also the cleaning and the etching of both surfaces are performed in the single system 1, the whole system can be further reduced in size.

In addition, according to the present exemplary embodiment, since both the grinding of both surfaces of the substrate and the etching of both surfaces of the substrate are performed in the single system 1, there are many processing conditions that can be corrected to maintain good product quality (for example, flatness). Thus, it is easy to feedback a quality inspection result to correct the processing conditions. Therefore, the good product quality can be automatically maintained over a long period of time, so that human labor can be reduced.

Figure 5:
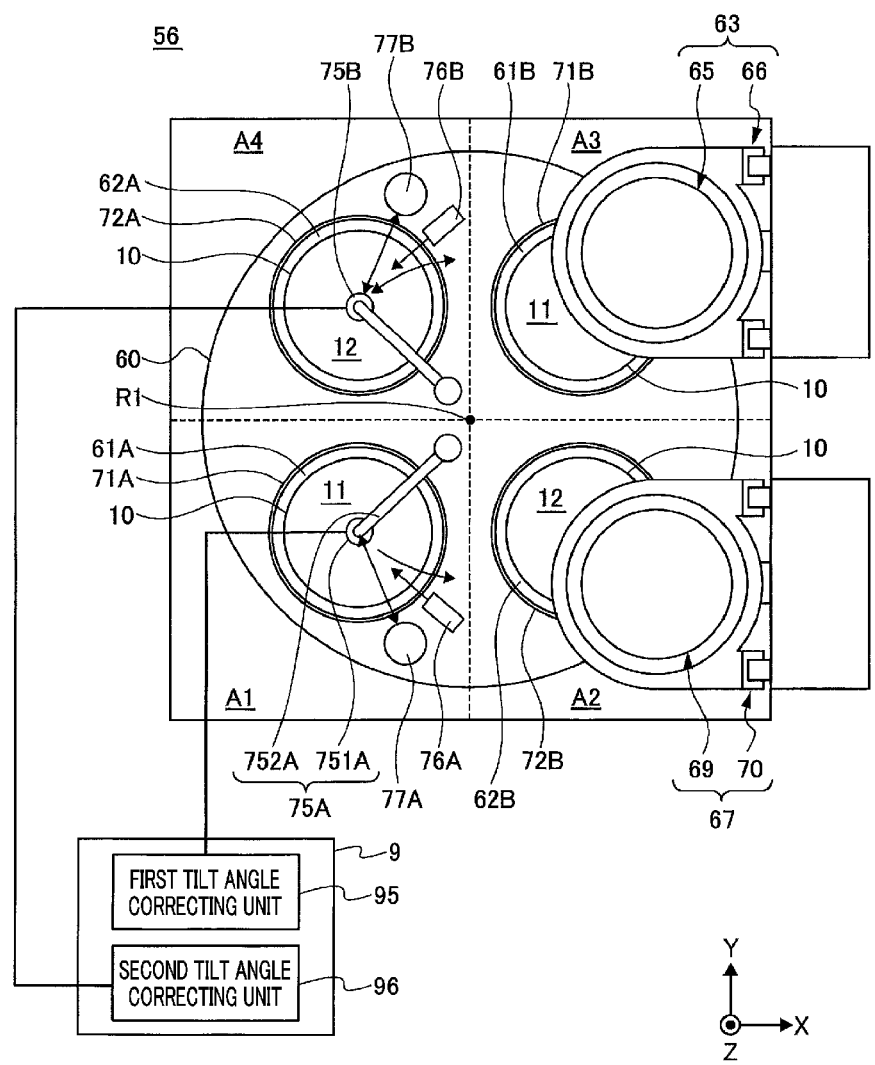
FIG. 5 is a plan view illustrating a substrate processing apparatus according to the exemplary embodiment.

FIG. 5 is a plan view illustrating the substrate processing apparatus according to the exemplary embodiment. The substrate processing apparatus 56 is configured to grind both the first main surface 11 of the substrate 10 and the second main surface 12 of the substrate 10. The substrate processing apparatus 56 has a rotary table 60, a pair of first substrate chucks 61A and 61B, a pair of second substrate chucks 62A and 62B, a first processing unit 63, and a second processing unit 67.

The rotary table 60 is configured to be rotated about a vertical rotation axis R1. The rotary table 60 holds thereon the first substrate chuck 61A, the second substrate chuck 62B, the first substrate chuck 61B, and the second substrate chuck 62A in this order at a regular distance therebetween around the rotation axis R1.

Figure 6:
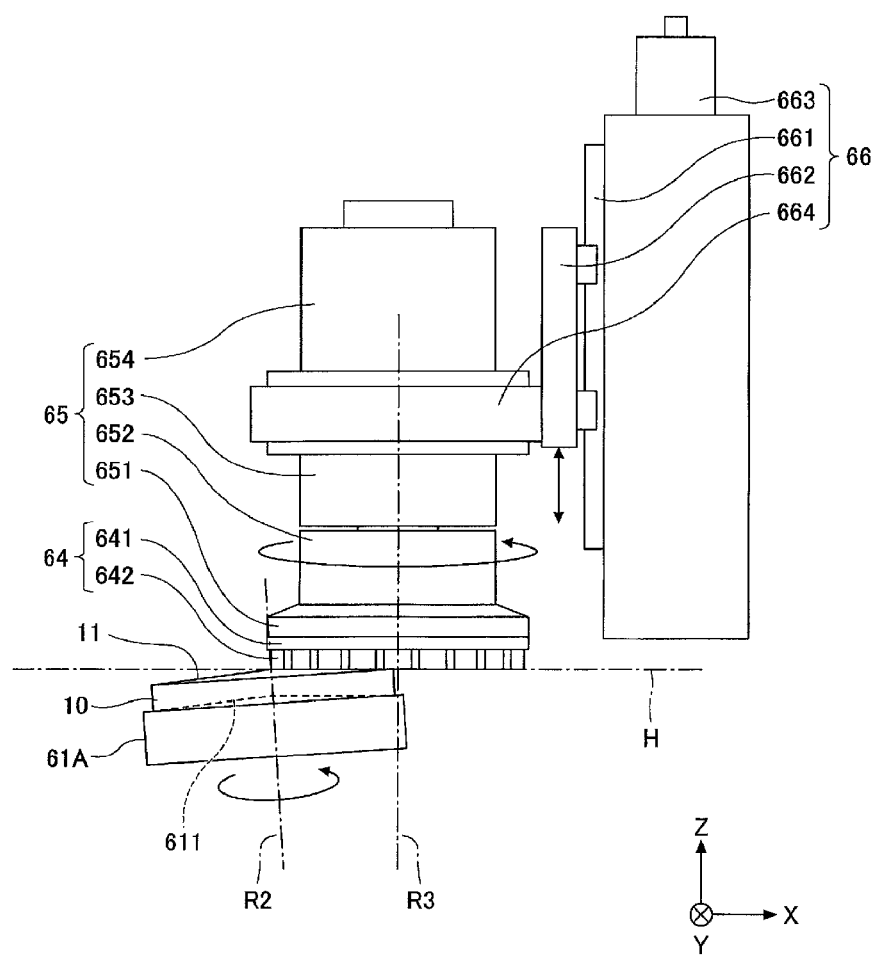
FIG. 6 is a side view illustrating a first operating unit and a first elevating unit of FIG. 5.

Each of the four substrate chucks 61A, 61B, 62A and 62B is held on the rotary table 60 so as to be rotated about a rotation axis R2, as shown in FIG. 6. Further, the rotation axis R1 of the rotary table 60 is an axis of revolution of the four substrate chucks 61A, 61B, 62A and 62B.

The pair of first substrate chucks 61A and 61B are symmetrically disposed with the rotation axis R1 of the rotary table 60 therebetween. Each of these first substrate chucks 61A and 61B holds the substrate 10 from below with the first main surface 11 of the substrate 10 facing upwards.

Likewise, the pair of second substrate chucks 62A and 62B are symmetrically disposed with the rotation axis R1 of the rotary table 60 therebetween. Each of these second substrate chucks 62A and 62B holds the substrate 10 from below with the second main surface 12 of the substrate 10 facing upwards.

The first processing unit 63 has a first operating unit 65 to which a first processing tool 64 is mounted. The first processing tool 64 is configured to process the first main surface 11 of the substrate 10 held by the first substrate chuck 61A (61B). The first processing tool 64 is mounted to the first operating unit 65 in a replaceable manner. A first elevating unit 66 is configured to elevate the first operating unit 65 up and down.

The first processing tool 64 thins the substrate 10, for example. As illustrated in FIG. 6, the first processing tool 64 includes an annular plate-shaped grinding wheel 641 and a plurality of whetstones 642 fixed to a bottom surface of the grinding wheel 641. The plurality of whetstones 642 are arranged in a ring shape along an edge of the bottom surface of the grinding wheel 641. The whetstones 642 are arranged on a same horizontal plane H.

Figure 7:
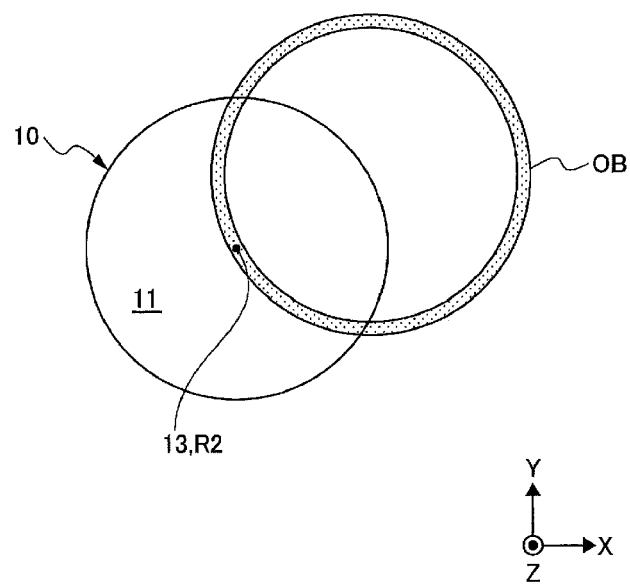
FIG. 7 is a plan view illustrating a trajectory of whetstones and a substrate of FIG. 6.

As shown in FIG. 7, a trajectory OB of the plurality of whetstones 642 arranged in the ring shape is set to pass through a center 13 of the top surface (for example, the first main surface 11) of the substrate 10.

The first operating unit 65 is equipped with a rotary plate 651 to which the first processing tool 64 is mounted in the replaceable manner, a spindle shaft 652 whose lower end is connected to the rotary plate 651, a shaft bearing 653 supporting the spindle shaft 652 in a rotatable manner, and a spindle motor 654 configured to rotate the spindle shaft 652, as shown in FIG. 6, for example. The spindle motor 654 rotates the spindle shaft 652, thus allowing the rotary plate 651 and the processing tool 64 to be rotated.

In addition, the first processing unit 63 is equipped with the first elevating unit 66 configured to elevate the first operating unit 65 up and down. By way of example, the first elevating unit 66 has a vertical guide 661, a slider 662 configured to be moved along the guide 661, and a motor 663 configured to move the slider 662. A holder 664 is fixed to the slider 662, and the holder 664 holds the first operating unit 65. The first operating unit 65 and the first processing tool 64 are moved up and down along with the slider 662.

The first elevating unit 66 lowers the first operating unit 65 and the first processing tool 64. The first processing tool 64 is lowered while being rotated, comes into contact with the top surface of the substrate 10 being rotated, and grinds the entire top surface of the substrate 10.

Like the first processing unit 63, the second processing unit 67 has a second operating unit 69 and a second elevating unit 70, as shown in FIG. 5. The second operating unit 69 is equipped with a non-illustrated second processing tool. Since the second processing tool has the same configuration as the first processing tool 64 except that it is configured to process the second main surface 12 of the substrate 10 held by the second substrate chuck 62A (62B), illustration of the second processing tool is omitted. The second elevating unit 70 is configured to elevate the second operating unit 69 up and down. The second operating unit 69 has the same configuration as the first operating unit 65, and the second elevating unit 70 has the same configuration as the first elevating unit 66.

As described above, the substrate processing apparatus 56 is equipped with the rotary table 60, the pair of first substrate chucks 61A and 61B, the pair of second substrate chucks 62A and 62B, the first processing unit 63, and the second processing unit 67. The first processing unit 63 processes the first main surface 11 of the substrate 10 held by the first substrate chuck 61A (61B), and the second processing unit 67 processes the second main surface 12 of the substrate 10 held by the second substrate chuck 62A (62B). Accordingly, both the processing of the first main surface 11 and the processing of the second main surface 12 can be performed on the single rotary table 60. Further, since both surfaces of the substrate 10 are ground by the single apparatus, the number of apparatuses required may be reduced as compared to a case where one surface of the substrate is ground by one apparatus and the other surface of the substrate is processed by another. Therefore, the entire system can be scaled down.

As depicted in FIG. 5, the substrate processing apparatus 56 has a pair of first tilt angle adjusting units 71A and 71B configured to independently adjust tilt angles of the rotation axes R2 of the pair of first substrate chucks 61A and 61B, respectively. One of these first tilt angle adjusting unit 71A is configured to adjust the tilt angle of the rotation axis R2 of the one first substrate chuck 61A. The other of the first tilt angle adjusting units 71B is configured to adjust the tilt angle of the other first substrate chuck 61B. Here, the tilt angle refers to a tilt angle with respect to a vertical line of the rotation axis R2. The tilt angle is represented by, for example, an angle formed by the rotation axis R2 and the Z axis when viewed from the X-axis direction and an angle formed by the rotation axis R2 and the Z axis when viewed from the Y-axis direction.

Since the two first tilt angle adjusting units 71A and 71B are the same, only one first tilt angle adjusting unit 71A will be described while omitting description of the other first tilt angle adjusting unit 71B. Further, only one first substrate chuck 61A will be described, and description of the other first substrate chuck 61B will be omitted.

Figure 8:
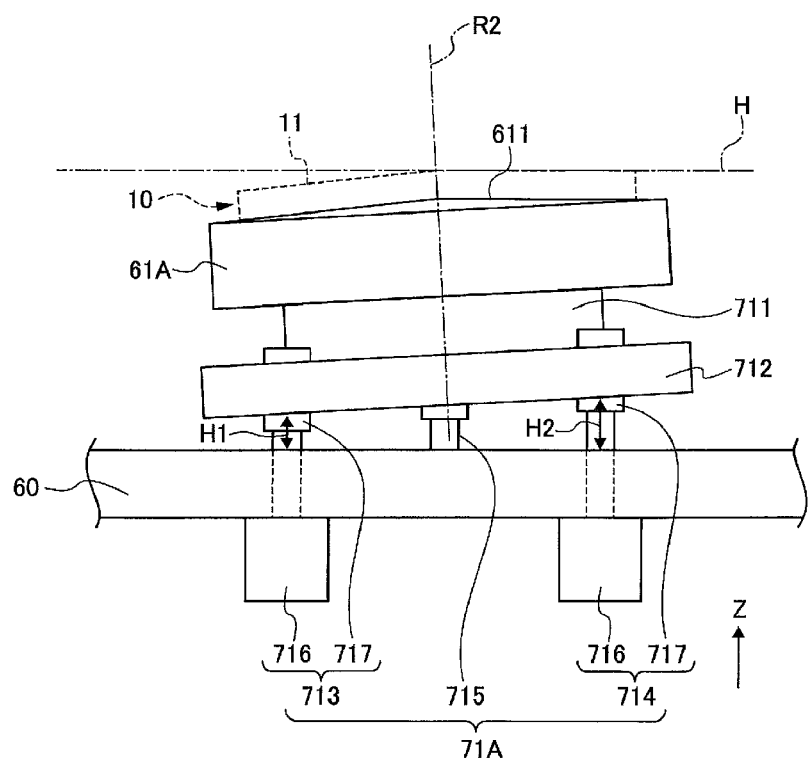
FIG. 8 is a side view illustrating a first tilt angle adjusting unit of FIG. 5.

As shown in FIG. 8, the first substrate chuck 61A is mounted to the rotary table 60 with the first tilt angle adjusting unit 71A therebetween. The first tilt angle adjusting unit 71A includes a support 711 configured to support the first substrate chuck 61A rotatably. A motor configured to rotate the first substrate chuck 61A about the rotation axis R2 is embedded in the support 711. The support 711 is provided with a flange 712. The first tilt angle adjusting unit 71A includes three connection members 713, 714 and 715 arranged at a regular distance therebetween (e.g., at an angular interval of 120° degrees) in a circumferential direction of the flange 712. The three connection members 713, 714 and 715 connect the flange 712 and the rotary table 60.

The two connection members 713 and 714 are provided so that heights H1 and H2 of the flange 712 with respect to the rotary table 60 are adjustable. The other connection member 715 is provided so that the height of the flange 712 with respect to the rotary table 60 is not adjustable. Each of the two connection members 713 and 714 has, for example, a motor 716 and a motion converting mechanism 717 configured to convert a rotational motion of the motor 716 into a linear motion of the flange 712. The motion converting mechanism 717 includes, for example, a ball screw. The first tilt angle adjusting unit 71A adjusts the tilt angle of the rotation axis R2 by changing the two heights H1 and H2.

The tilt angle of the rotation axis R2 is represented by the two heights H1 and H2. Further, although the other connection member 715 is provided so that the height of the flange 712 with respect to the rotary table 60 is not adjustable in the present exemplary embodiment, it may be installed so that the height of the flange 712 is adjustable.

The first substrate chuck 61A has a substrate holding surface 611 for holding the substrate 10 thereon. The substrate holding surface 611 holds the substrate 10 from below. The substrate 10 has a shape concentric with the substrate holding surface 611, and is attracted to the substrate holding surface 611. The entire bottom surface (for example, the second main surface 12) of the substrate 10 is attracted to the substrate holding surface 611 so that an intersection point between the substrate holding surface 611 and the rotation axis R2 coincides with the center of the substrate 10.

The substrate holding surface 611 of the first substrate chuck 61A is a conical surface symmetrical about the rotation axis R2 of the first substrate chuck 61A, as illustrated in FIG. 6 and FIG. 8. When the substrate 10 is attracted to the conical substrate holding surface 611, the top surface (for example, the first main surface 11) of the substrate 10 also becomes a conical surface, conforming to the substrate holding surface 611.

If the tilt angle of the rotation axis R2 is changed, a distribution of a contact pressure between the whetstones 642 and the substrate 10 on the trajectory OB of the whetstones 642 shown in FIG. 7 is changed. As compared to a position where the contact pressure is low, the substrate 10 is thinned at a position where the contact pressure is high. Accordingly, a plate thickness distribution of the substrate 10 in a diametrical direction thereof can be adjusted by adjusting the tilt angle of the rotation axis R2.

The substrate holding surface 611 of the first substrate chuck 61A is ground to have the conical shape by the first processing unit 63 in the state that it is not holding the substrate 10. The tilt angle of the rotation axis R2 when the substrate holding surface 611 of the first substrate chuck 61A is ground into the conical shape becomes a reference value of the tilt angle of the rotation axis R2 when grinding the first main surface 11 of the substrate 10. When the tilt angle of the rotation axis R2 equals to the reference value during the grinding of the first main surface 11, the plate thickness distribution of the substrate 10 in the diametrical direction becomes uniform after the grinding of the first main surface 11. The plate thickness distribution becomes uniform in the single substrate 10, and between the plurality of substrates 10 as well.

Furthermore, before grinding the substrate holding surfaces 611 and 611 of the pair of first substrate chucks 61A and 61B into the conical shape, height alignment between these substrate holding surfaces 611 and 611 is performed, and, then, the rotation axes R2 and R2 are tilted equally. The substrate holding surfaces 611 and 611 are ground into the conical shape in the state that they are tilted equally. Therefore, between the substrate 10 held by one first substrate chuck 61A and the substrate 10 held by the other first substrate chuck 61B, the plate thickness distribution after the grinding becomes uniform.

As depicted in FIG. 5, the substrate processing apparatus 56 has a pair of second tilt angle adjusting units 72A and 72B configured to independently adjust tilt angles of the rotation axes R2 of the pair of second substrate chucks 62A and 62B, respectively. One of these second tilt angle adjusting units 72A is configured to adjust the tilt angle of the rotation axis R2 of one second substrate chuck 62A. The other of the second tilt angle adjusting units 72B is configured to adjust the tilt angle of the other second substrate chuck 62B.

Since these second tilt angle adjusting units 72A and 72B are the same as the first tilt angle adjusting unit 71A, description thereof will be omitted. Further, since the second substrate chucks 62A and 62B are the same as the first substrate chuck 61A except that they have substrate holding surfaces ground into the conical shape by the second processing unit 67 instead of the first processing unit 63, description thereof will also be omitted here.

In addition, before grinding the substrate holding surfaces of the pair of second substrate chucks 62A and 62B into the conical shape, height alignment between the substrate holding surfaces is performed, and, then, the rotation axes R2 and R2 thereof are equally tilted. These substrate holding surfaces are ground into the conical shape in the state that they are tilted equally. Therefore, between the substrate 10 held by one second substrate chuck 62A and the substrate 10 held by the other second substrate chuck 62B, the plate thickness distribution after the grinding becomes uniform.

As stated above, the substrate processing apparatus 56 has the first tilt angle adjusting units 71A and 71B and the second tilt angle adjusting units 72A and 72B, and adjusts the tilt angles of the rotation axes R2 of the first substrate chucks 61A and 61B and the second substrate chucks 62A and 62B independently. The reason why the adjustment of the tilt angle of the rotation axis R2 is performed for each substrate chuck 61 is that a mounting error of each substrate chuck 61 to the rotary table 60 may be different.

However, the first substrate chuck 61A (61B) holds the substrate 10 ground by the first processing unit 63 and does not hold the substrate 10 ground by the second processing unit 67. Meanwhile, the second substrate chuck 62A (62B) holds the substrate 10 ground by the second processing unit 67 and does not hold the substrate 10 ground by the first processing unit 63. Further, although the rotation axis R3 of the spindle shaft 652 of the first processing unit 63 and the rotation axis of the spindle shaft of the second processing unit 67 are both arranged vertically, they may be slightly inclined due to the mounting error or the like. In addition, the mounting error may be different between the first processing unit 63 and the second processing unit 67.

Thus, the first substrate chuck 61A (61B) includes the substrate holding surface 611 ground by the first processing unit 63, not the second processing unit 67, as described above. The first substrate chuck 61A (61B) and the substrate 10 held by the first substrate chuck 61A (61B) are ground with the same first processing unit 63. Therefore, when the tilt angle of the rotation axis R2 of the first substrate chuck 61A (61B) equals to the aforementioned reference value, the plate thickness distribution of the substrate 10 in the diametrical direction thereof is highly likely to be uniform after the grinding by the first processing unit 63. The plate thickness distribution becomes uniform in the single substrate 10 and between the plurality of substrates 10 as well. Furthermore, between the substrate 10 held by one first substrate chuck 61A and the substrate 10 held by the other first substrate chuck 61B, the plate thickness distribution after the grinding becomes uniform. In addition, even if the plate thickness distribution becomes non-uniform due to the wear of the first processing tool 64 or the like, it is easy to correct the tilt angle since it is originally uniform.

Likewise, the second substrate chuck 62A (62B) includes the substrate holding surface ground by the second processing unit 67, not the first processing unit 63, as mentioned above. The second substrate chuck 62A (62B) and the substrate 10 held by the second substrate chuck 62A (62B) are ground with the same second processing unit 67. Therefore, when the tilt angle of the rotation axis R2 of the second substrate chuck 62A (62B) equals to the reference value, the plate thickness distribution of the substrate 10 in the diametrical direction thereof is highly likely to be uniform after the grinding by the second processing unit 67. The plate thickness distribution is uniform in the single substrate 10 and between the plurality of substrates 10 as well. Further, between the substrate 10 held by one second substrate chuck 62A and the substrate 10 held by the other second substrate chuck 62B, the plate thickness distribution after the grinding becomes uniform. In addition, even if the plate thickness distribution becomes non-uniform due to the wear of the second processing tool or the like, it is easy to correct the tilt angle since it is originally uniform.

As shown in FIG. 5, the substrate processing apparatus 56 has a first plate thickness distribution measuring unit 75A configured to measure the plate thickness of the substrate 10 ground by the first processing unit 63 at multiple points of the substrate 10 in the diametrical direction thereof. The first plate thickness distribution measuring unit 75A includes a first plate thickness detector 751A, such as a non-contact type laser sensor, which is configured to detect the plate thickness of the substrate 10 ground by the first processing unit 63. For example, the first plate thickness detector 751A detects the plate thickness of the substrate 10 based on a phase difference between light reflected from the top surface of the substrate 10 and light reflected from the bottom surface of the substrate 10.

The first plate thickness distribution measuring unit 75A includes a first revolving arm 752A, and the first revolving arm 752A is configured to be revolved about a base end thereof and hold the first plate thickness detector 751A at a leading end thereof. When the first revolving arm 752A is revolved, the plate thickness can be measured at the multiple points of the substrate 10 in the diametrical direction thereof. Furthermore, the first revolving arm 752A may hold thereon a multiple number of first plate thickness detectors 751A at a certain distance therebetween in a lengthwise direction thereof. In addition, the first plate thickness distribution measuring unit 75A may include a slider configured to be moved along a guide rail instead of the first revolving arm 752A, and this slider may hold the first plate thickness detector 751A.

Likewise, the substrate processing apparatus 56 is equipped with a second plate thickness distribution measuring unit 75B configured to measure the plate thickness of the substrate 10 ground by the second processing unit 67 at multiple points of the substrate 10 in the diametrical direction thereof. Since the second plate thickness distribution measuring unit 75B is the same as the first plate thickness distribution measuring unit 75A, description thereof will be omitted here.

The control device 9 includes a first tilt angle correcting unit 95 configured to correct the tilt angle of the rotation axis R2 of the first substrate chuck 61A (61B) based on the plate thickness distribution of the substrate 10 in the diametrical direction which has been measured by the first plate thickness distribution measuring unit 75A. Since the first tilt angle correcting unit 95 corrects the tilt angle of the rotation axis R2 of the first substrate chuck 61A (61B) based on the plate thickness distribution of the substrate 10 processed by the first processing unit 63, plate thickness distributions after the current processing can be uniformed. In addition, if the plate thickness distribution measured by the first plate thickness distribution measuring unit 75A falls within a tolerance range, the correction of the tilt angle is not performed.

The tilt angle of the rotation axis R2 of the first substrate chuck 61A is corrected based on the plate thickness distribution of the substrate 10, which is held by the first substrate chuck 61A and has been processed by the first processing unit 63, in the diametrical direction thereof so that the plate thickness distribution after the current processing becomes uniform. Likewise, the tilt angle of the rotation axis R2 of the first substrate chuck 61B is corrected based on the plate thickness distribution of the substrate 10, which is held by the first substrate chuck 61B and has been processed by the first processing unit 63, in the diametrical direction so that the plate thickness distribution after the current processing becomes uniform.

Further, the control device 9 includes a second tilt angle correcting unit 96 configured to correct the tilt angle of the rotation axis R2 of the second substrate chuck 62A (62B) based on the plate thickness distribution of the substrate 10 in the diametrical direction which has been measured by the second plate thickness distribution measuring unit 75B. The second tilt angle correcting unit 96 corrects the tilt angle of the rotation axis R2 of the second substrate chuck 62A (62B) based on the plate thickness distribution of the substrate 10 processed by the second processing unit 67, so that the plate thickness distribution after the current processing becomes uniform. If the plate thickness distribution measured by the second plate thickness distribution measuring unit 75B falls within a tolerance range, the correction of the tilt angle is not performed.

The tilt angle of the rotation axis R2 of the second substrate chuck 62A is corrected based on the plate thickness distribution of the substrate 10, which is held by the second substrate chuck 62A and has been processed by the second processing unit 67, in the diametrical direction thereof so that the plate thickness distribution thereof becomes uniform after the current processing. Likewise, the tilt angle of the rotation axis R2 of the second substrate chuck 62B is corrected based on the plate thickness distribution of the substrate 10, which is held by the second substrate chuck 62B and has been processed by the second processing unit 67, in the diametrical direction thereof so that the plate thickness distribution thereof becomes uniform after the current processing.

The substrate processing apparatus 56 is equipped with a first substrate cleaning unit 76A configured to clean the substrate 10 ground by the first processing unit 63. Since a contaminant of the substrate 10 can be removed before the plate thickness of the substrate 10 is measured by the first plate thickness distribution measuring unit 75A, measurement accuracy of the first plate thickness distribution measuring unit 75A may be improved. Furthermore, the grinding debris can be suppressed from being taken out of the substrate processing apparatus 56 along with the substrate 10. The first substrate cleaning unit 76A has a nozzle configured to discharge a cleaning liquid. The nozzle discharges the cleaning liquid from an outside of the substrate 10 in the diametrical direction toward an inner side of the substrate 10 in the diametrical direction. By way of non-limiting example, DIW (Deionized Water) or the like may be used as the cleaning liquid. By supplying the cleaning liquid from the nozzle to the substrate 10 while rotating the substrate 10 along with the first substrate chuck 61A (61B), the entire top surface of the substrate 10 is cleaned. The nozzle may be a dual-fluid nozzle configured to mix the cleaning liquid with a gas and discharge the mixture.

Likewise, the substrate processing apparatus 56 is equipped with a second substrate cleaning unit 76B configured to clean the substrate 10 ground by the second processing unit 67. Since a contaminant of the substrate 10 can be removed before the plate thickness of the substrate 10 is measured by the second plate thickness distribution measuring unit 75B, measurement accuracy of the second plate thickness distribution measuring unit 75B may be improved. Further, the grinding debris can be suppressed from being taken out of the substrate processing apparatus 56 along with the substrate 10. Since the second substrate cleaning unit 76B is the same as the first substrate cleaning unit 76A, description thereof will be omitted.

The substrate processing apparatus 56 has a first substrate chuck cleaning unit 77A configured to clean the first substrate chuck 61A (61B) after the substrate 10 ground by the first processing unit 63 is taken out. The first substrate chuck cleaning unit 77A cleans the substrate holding surface 611 of the first substrate chuck 61A (61B). Thus, when a new substrate 10 is placed on the substrate holding surface 611, the grinding debris can be suppressed from being swept in. The first substrate chuck cleaning unit 77A includes a disk brush (not shown) configured to rub the substrate holding surface 611 to wash it; and a non-illustrated driving unit configured to move the disk brush. Here, a roll brush, a sponge, or the like may be used instead of the disk brush.

Likewise, the substrate processing apparatus 56 has a second substrate chuck cleaning unit 77B configured to clean the second substrate chuck 62A (62B) after the substrate 10 ground by the second processing unit 67 is taken out. Thus, when a new substrate 10 is placed on the substrate holding surface, the grinding debris can be suppressed from being swept in. Since the second substrate chuck cleaning unit 77B is the same as the first substrate chuck cleaning unit 77A, description thereof will be omitted.

Figure 9A:
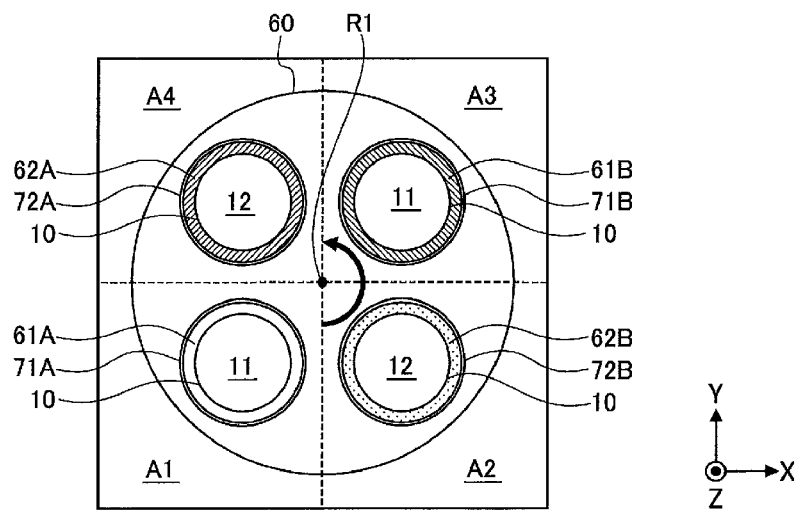
FIG. 9A is a plan view illustrating a rotational operation of a rotary table of FIG. 5.
Figure 9B:
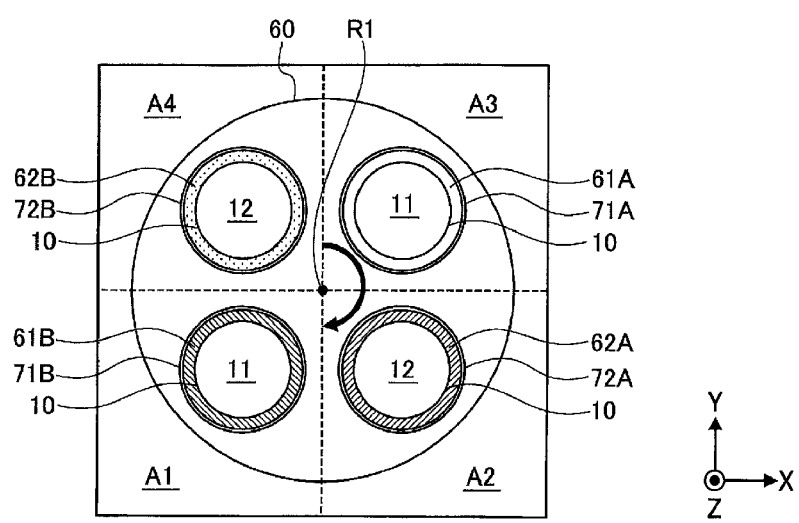
FIG. 9B is a plan view illustrating the rotational operation of the rotary table of FIG. 5 following that of FIG. 9A.

As shown in FIG. 9A and FIG. 9B, a first position A1, a second position A2, a third position A3, and a fourth position A4 are set around the rotation axis R1 of the rotary table 60 in this order. Whenever the rotary table 60 is rotated 180 degrees, the pair of first substrate chucks 61A and 61B are positioned at the first position A1 and the third position A3 alternately. Further, whenever the rotary table 60 is rotated 180 degrees, the pair of second substrate chucks 62A and 62B are positioned at the second position A2 and the fourth position A4 alternately.

Referring to FIG. 9A and FIG. 9B, the carrying-in/carrying-out and the grinding of one substrate 10 will be first explained. Here, for the simplicity of explanation, description of the cleaning of the substrate 10, the measurement of the plate thickness of the substrate 10, the correction of the tilt angle, and the cleaning of the substrate chuck will be omitted.

The substrate 10 is first transferred from the third transfer device 51 onto the first substrate chuck 61A at, for example, the first position A1 shown in FIG. 9A, and is held on the first substrate chuck 61A with the first main surface 11 of the substrate 10 facing upwards. Then, the rotary table 60 is rotated from a state shown in FIG. 9A into a state shown in FIG. 9B, and the substrate 10 is moved from the first position A1 to the third position A3 together with the first substrate chuck 61A.

Subsequently, the substrate 10 is processed by the first processing unit 63 at the third position A3. The first main surface 11, which is the top surface of the substrate 10, is processed. Thereafter, the rotary table 60 is rotated from the state shown in FIG. 9B into the state shown in FIG. 9A, and the substrate 10 is moved from the third position A3 to the first position A1 together with the first substrate chuck 61A.

Thereafter, the substrate 10 is transferred from the first substrate chuck 61A to the third transfer device 51 at the first position A1, and is taken out of the substrate processing apparatus 56. Subsequently, the substrate 10 is inverted upside down at the outside of the substrate processing apparatus 56, and is brought back into the substrate processing apparatus 56 by the third transfer device 51.

Next, the substrate 10 is delivered from the third transfer device 51 onto the second substrate chuck 62A at, for example, the fourth position A4 shown in FIG. 9A, and is held on the second substrate chuck 62A with the second main surface 12 of the substrate 10 facing upwards. Then, the rotary table 60 is rotated from the state shown in FIG. 9A into the state shown in FIG. 9B, and the substrate 10 is moved from the fourth position A4 to the second position A2 together with the second substrate chuck 62A.

Subsequently, the substrate 10 is processed by the second processing unit 67 at the second position A2. The second main surface 12, which is the top surface of the substrate 10, is processed. Then, the rotary table 60 is rotated from the state shown in FIG. 9B into the state shown in FIG. 9A, and the substrate 10 is moved from the second position A2 to the fourth position A4 together with the second substrate chuck 62A.

Thereafter, the substrate 10 is transferred from the second substrate chuck 62A to the third transfer device 51 at the fourth position A4, and is taken out of the substrate processing apparatus 56.

Figure 10:
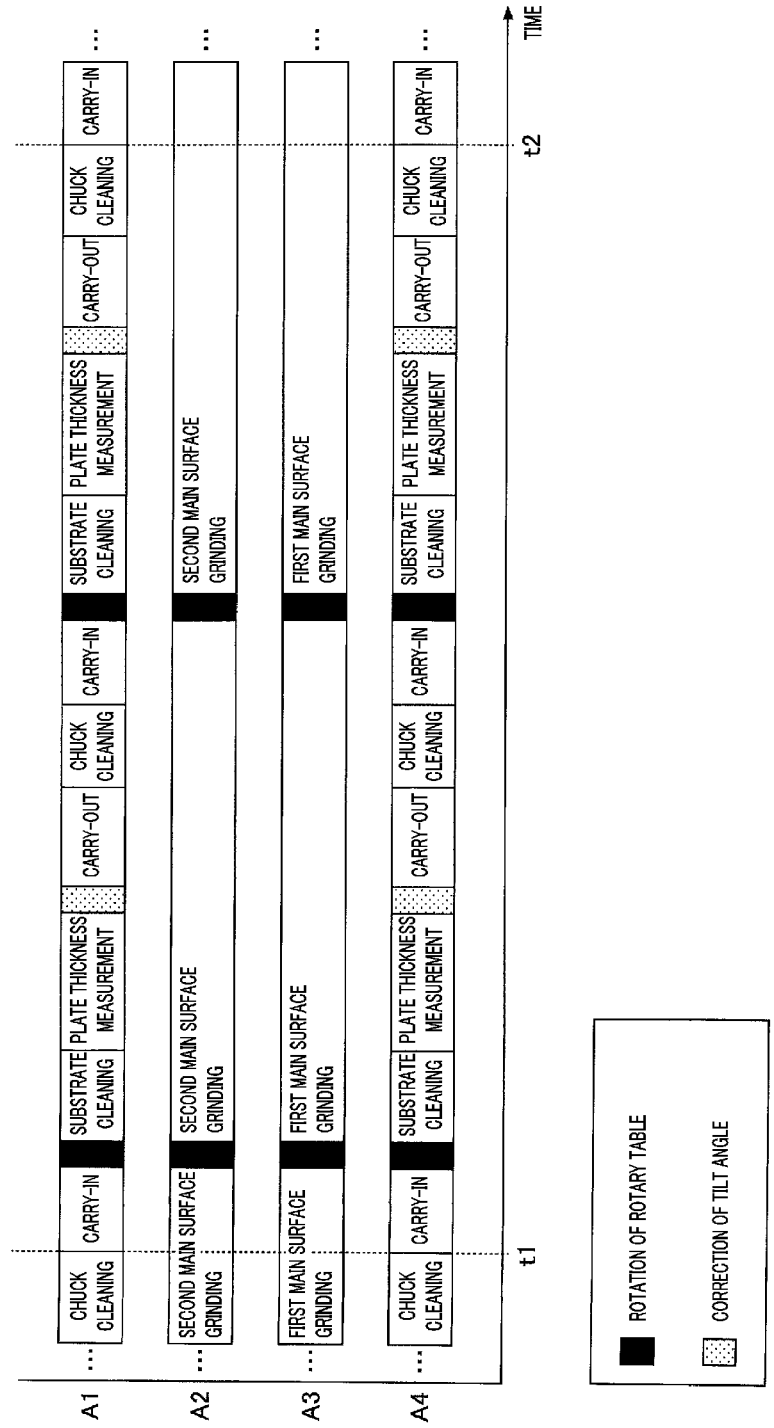
FIG. 10 is a timing chart illustrating processings performed at a first position, a second position, a third position, and a fourth position of FIG. 5.

Now, processings performed at the first position A1, the second position A2, the third position A3 and the fourth position A4 will be described with reference to FIG. 10. At the first position A1, the carry-in/carry-out of the substrate 10 by the third transfer device 51 is performed, and, also, the attachment/detachment of the substrate 10 to/from the first substrate chuck 61A (61B) is performed. At the first position A1, the cleaning of the substrate 10 by the first substrate cleaning unit 76A, the measurement of the plate thickness of the substrate 10 by the first plate thickness distribution measuring unit 75A, and the correction of the tilt angle by the first tilt angle correcting unit 95 are performed. Further, at the first position A1, the cleaning of the first substrate chuck 61A (61B) by the first substrate chuck cleaning unit 77A is also performed. The order of these processings is not limited to the example shown in FIG. 10. By way of example, the correction of the tilt angle may be performed after the plate thickness of the substrate 10 is measured or after substrate 10 is carried out. In the latter case, the correction of the tilt angle may be performed during the rotation of the rotary table 60 from the first position A1 to the third position A3 after a new substrate 10 is carried in, for example. Further, the correction of the tilt angle may be performed at the third position A3 as will be described later. However, if the plate thickness distribution measured by the first plate thickness distribution measuring unit 75A falls within the tolerance range, the correction of the tilt angle is not performed.

At the second position A2, the grinding of the second main surface 12 of the substrate 10 by the second processing unit 67 is performed. Further, although the correction of the tilt angle of the rotation axis R2 of the second substrate chuck 62A (62B) is performed at the fourth position A4 in FIG. 10, it may be performed at the second position A2. In the latter case, the correction of the tilt angle of the rotation axis R2 is performed before the grinding of the second main surface 12.

At the third position A3, the grinding of the first main surface 11 of the substrate 10 by the first processing unit 63 is performed. Further, although the correction of the tilt angle of the rotation axis R2 of the first substrate chuck 61A (61B) is performed at the first position A1 in FIG. 10, it may be performed at the third position A3. In the latter case, the correction of the tilt angle of the rotation axis R2 is performed before the grinding of the first main surface 11.

At the fourth position A4, the carry-in/carry-out of the substrate 10 by the third transfer device 51 is performed, and, also, the attachment/detachment of the substrate 10 to/from the second substrate chuck 62A (62B) are performed. Further, at the fourth position A4, the cleaning of the substrate 10 by the second substrate cleaning unit 76B, the measurement of the plate thickness of the substrate 10 by the second plate thickness distribution measuring unit 75B, and the correction of the tilt angle by the second tilt angle correcting unit 96 are performed. In addition, at the fourth position A4, the cleaning of the second substrate chuck 62A (62B) by the second substrate chuck cleaning unit 77B is also performed. The order of these processings is not limited to the example shown in FIG. 10. By way of example, the correction of the tilt angle may be performed after the plate thickness of the substrate 10 is measured or after the substrate 10 is carried out. In the latter case, the correction of the tilt angle may be performed during the rotation of the rotary table 60 from the fourth position A4 to the second position A2 after the new substrate 10 is carried in, for example. Further, the correction of the tilt angle may be performed at the second position A2, as stated above. However, if the plate thickness distribution measured by the second plate thickness distribution measuring unit 75B falls within the tolerance range, the correction of the tilt angle is not performed.

Figure 11:
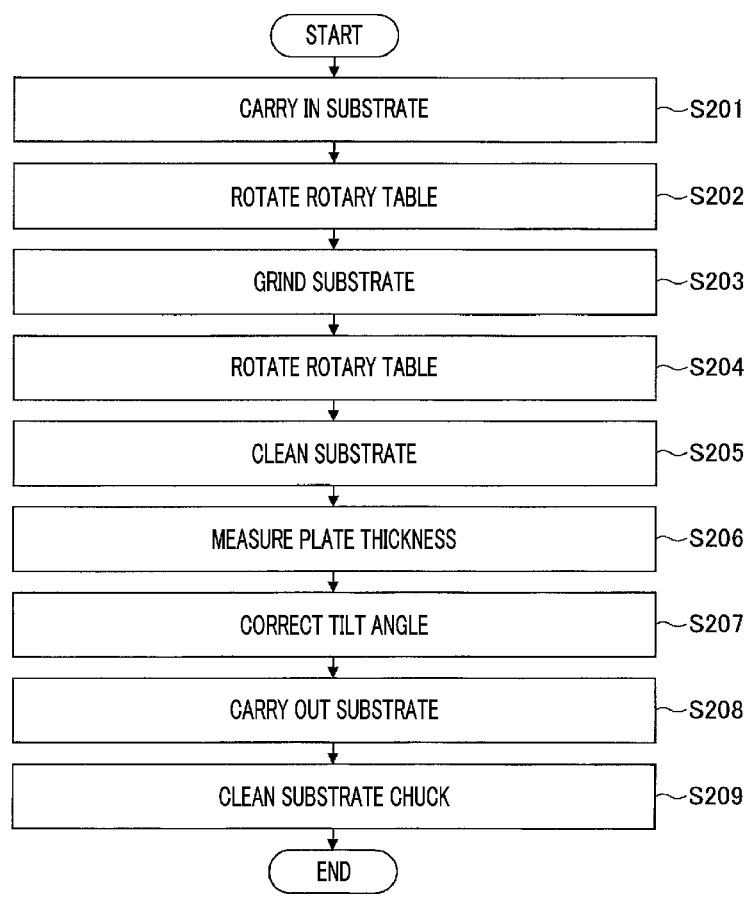
FIG. 11 is a flowchart illustrating processings performed by using a first substrate chuck in a range from a time t1 to a time t2 of FIG. 10.

Finally, processings performed by using the first substrate chuck 61A in a range from a time t1 to time t2 of FIG. 10 will be mainly described with reference to FIG. 11. At the time t1 of FIG. 10, the rotary table 60 is in the state shown in FIG. 9A. The processings shown in FIG. 11 are performed under the control of the control device 9. Further, since processings performed by using the first substrate chuck 61B and processings performed by using the second substrate chucks 62A and 62B are the same as those described in FIG. 11, illustration thereof will be omitted here.

First, the third transfer device 51 carries in the substrate 10 (S201), and the first substrate chuck 61A receives the substrate 10. In the meanwhile, the grinding of the second main surface 12 of the substrate 10 held by the second substrate chuck 62B is performed at the second position A2, as shown in FIG. 10. Further, at the third position A3, the grinding of the first main surface 11 of the substrate 10 held by the first substrate chuck 61B is performed. At the fourth position A4, a new substrate 10 is carried in.

Subsequently, the rotary table 60 is rotated by 180° from the state of FIG. 9A, as indicated by an arrow in FIG. 9A (S202). As a result, the rotary table 60 comes into the state of FIG. 9B. The first substrate chuck 61A is moved from the first position A1 to the third position A3, and the first substrate chuck 61B is moved from the third position A3 to the first position A1. Further, the second substrate chuck 62A is moved from the fourth position A4 to the second position A2, and the second substrate chuck 62B is moved from the second position A2 to the fourth position A4.

Subsequently, the first processing unit 63 grinds the first main surface 11 of the substrate 10 held by the first substrate chuck 61A (S203). This grinding is performed at the third position A3. In the meanwhile, the cleaning of the substrate 10, the measurement of the plate thickness of the substrate 10, the correction of the tilt angle of the rotation axis R2 of the first substrate chuck 61B, the carry-out of the substrate 10, the cleaning of the first substrate chuck 61B, and the carry-in of the new substrate 10 are performed at the first position A1, as illustrated in FIG. 10. Further, at the second position A2, the grinding of the second main surface 12 of the substrate 10 held by the second substrate chuck 62A is performed. Also, at the fourth position A4, the cleaning of the substrate 10, the measurement of the plate thickness of the substrate 10, the correction of the tilt angle of the rotation axis R2 of the second substrate chuck 62B, the carry-out of the substrate 10, the cleaning of the second substrate chuck 62B, and the carry-in of the new substrate 10 are performed.

Thereafter, the rotary table 60 is rotated by 180° from the state of FIG. 9B, as indicated by an arrow shown in FIG. 9B (S204). As a result, the rotary table 60 comes into the state of FIG. 9A. The first substrate chuck 61A is moved from the third position A3 to the first position A1, and the first substrate chuck 61B is moved from the first position A1 to the third position A3. Further, the second substrate chuck 62A is moved from the second position A2 to the fourth position A4, and the second substrate chuck 62B is moved from the fourth position A4 to the second position A2.

Then, the first substrate cleaning unit 76A cleans the substrate 10 held by the first substrate chuck 61A (S205), and the first plate thickness distribution measuring unit 75A measures the plate thickness of the substrate 10 (S206). Then, the first tilt angle correcting unit 95 corrects the tilt angle of the rotation axis R2 of the first substrate chuck 61A (S207). Further, the third transfer device 51 receives the substrate 10 from the first substrate chuck 61A and carries it out (S208), and the first substrate chuck cleaning unit 77A cleans the first substrate chuck 61A (S209). Thereafter, the processings starting from the process S201 shown in FIG. 11 are performed again.

While the processes S205 to S209 and the process S201 are being performed at the first position A1, the following processings are performed at the second to fourth positions A2, A3 and A4. At the second position A2, the grinding of the second main surface 12 of the substrate 10 held by the second substrate chuck 62B is performed. Further, at the third position A3, the grinding of the first main surface 11 of the substrate 10 held by the first substrate chuck 61B is performed. Also, at the fourth position A4, the cleaning of the substrate 10, the measurement of the plate thickness of the substrate 10, the correction of the tilt angle of the rotation axis R2 of the second substrate chuck 62A, the carry-out of the substrate 10, the cleaning of the second substrate chuck 62A, and the carry-in of the new substrate 10 is performed.

Figure 12:
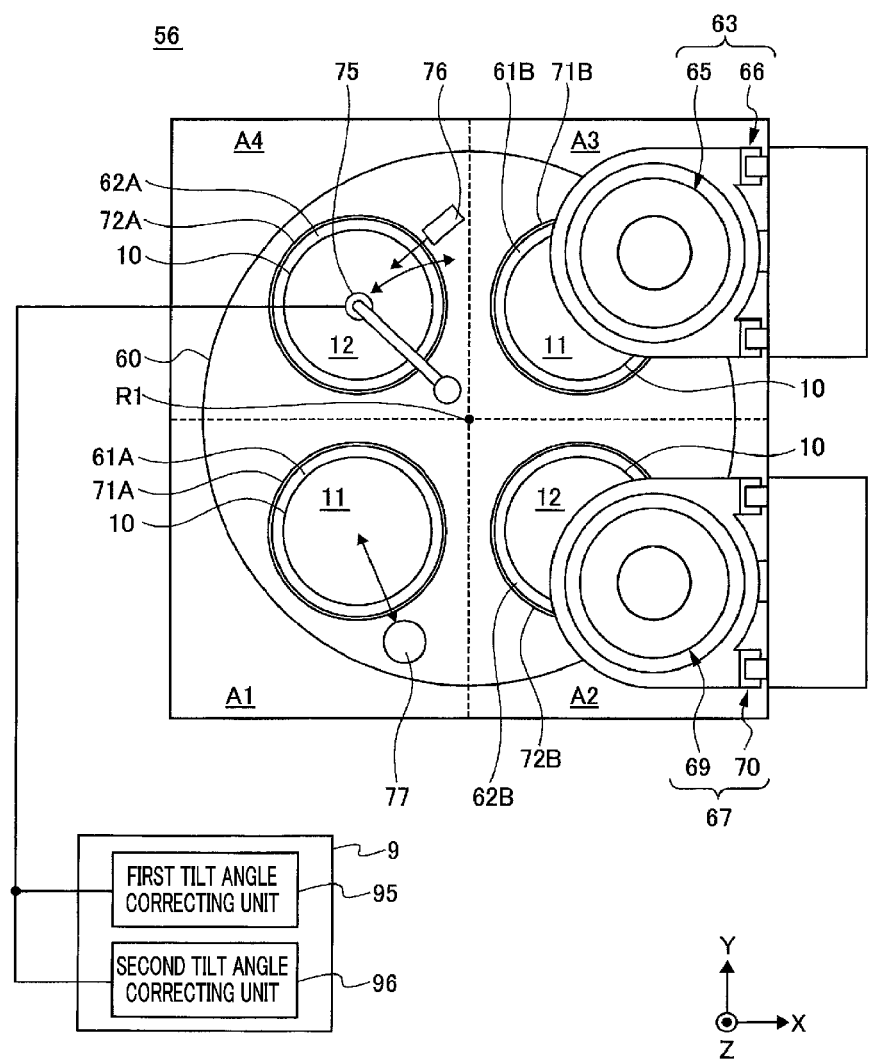
FIG. 12 is a plan view illustrating a substrate processing apparatus according to a modification example.

FIG. 12 is a plan view illustrating a substrate processing apparatus according to a modification example. In the following, description will mainly focus on a difference between the substrate processing apparatus 56 of the present modification example and the substrate processing apparatus 56 of the above-described exemplary embodiment. In this modification example, the substrate chucks 61A, 61B, 62A and 62B are respectively moved to the first position A1, the second position A2, the third position A3 and the fourth position A4 in this order, and are returned to the first position A1 from the fourth position A4, as illustrated in FIG. 13A to FIG. 13D.

According to the present modification example, all the substrate chucks 61A, 61B, 62A and 62B pass through the same positions in the same order. Therefore, the plate thicknesses of the substrates 10 held by all the substrate chucks 61A, 61B, 62A and 62B can be measured at a specific position, for example, at the fourth position A4. Thus, the number of the plate thickness distribution measuring unit 75 can be reduced. Further, the substrates 10 held by all the substrate chucks 61A, 61B, 62A and 62B can be cleaned at a certain position, for example, at the fourth position, so that the number of the substrate cleaning unit 76 can be reduced. Moreover, all the substrate chucks 61A, 61B, 62A, and 62B can be cleaned at a specific position, for example, at the first position A1, so that the number of the substrate chuck cleaning unit 77 can be reduced.

First, the carrying-in/carrying-out and the grinding of one substrate 10 will be described with reference to FIG. 13A to FIG. 13D. Here, for the simplicity of description, explanation of the cleaning of the substrate 10, the measurement of the plate thickness of the substrate 10, the correction of the tilt angle, and the cleaning of the substrate chuck will be omitted.

Figure 13A:
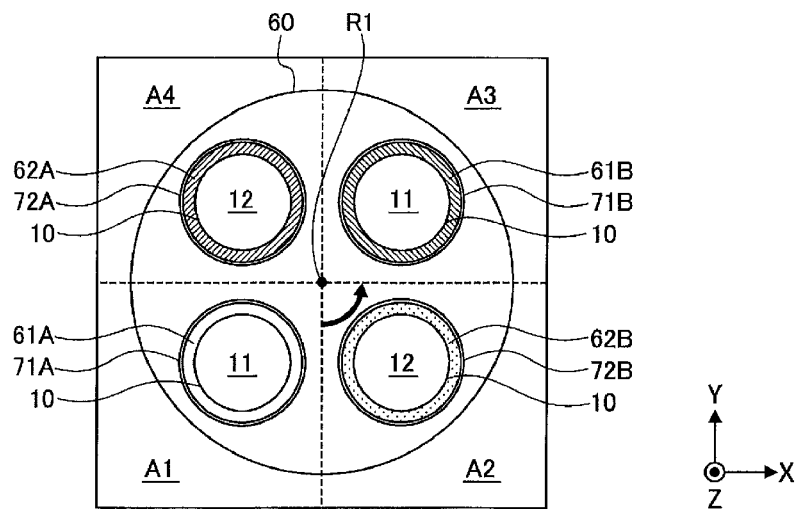
FIG. 13A is a plan view illustrating a rotational operation of the rotary table of FIG. 12.

The substrate 10 is first transferred from the third transfer device 51 onto the first substrate chuck 61A at the first position A1 shown in FIG. 13A, for example, and is held on the first substrate chuck 61A with the first main surface 11 of the substrate 10 facing upwards. Thereafter, the rotary table 60 is rotated from a state shown in FIG. 13A into a state shown in FIG. 13C through a state shown in FIG. 13B, and the substrate 10 is moved from the first position A1 to the third position A3 together with the first substrate chuck 61A.

Afterwards, the substrate 10 is processed by the first processing unit 63 at the third position A3. The first main surface 11, which is the top surface of the substrate 10, is processed. Then, the rotary table 60 is rotated from the state shown in FIG. 13C into the state shown in FIG. 13A through a state shown in FIG. 13D, and the substrate 10 is moved from the third position A3 to the first position A1 together with the first substrate chuck 61A.

Thereafter, the substrate 10 is transferred from the first substrate chuck 61A to the third transfer device 51 at the first position A1, and is taken out of the substrate processing apparatus 56. Subsequently, the substrate 10 is inverted upside down at the outside of the substrate processing apparatus 56 and brought back into the substrate processing apparatus 56 by the third transfer device 51.

Figure 13B:
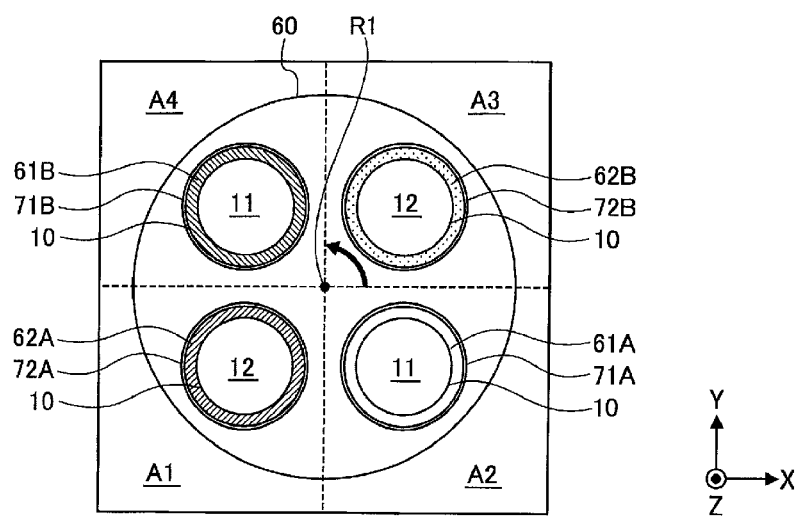
FIG. 13B is a plan view illustrating the rotational operation of the rotary table of FIG. 12 following that of FIG. 13A.

Next, the substrate 10 is transferred from the third transfer device 51 onto the second substrate chuck 62A at the first position A1 shown in FIG. 13B, for example, and is held on the second substrate chuck 62A with the second main surface 12 of the substrate 10 facing upwards. Thereafter, the rotary table 60 is rotated from the state shown in FIG. 13B into the state shown in FIG. 13C, and the substrate 10 is moved from the first position A1 to the second position A2 together with the second substrate chuck 62A.

Then, the substrate 10 is processed by the second processing unit 67 at the second position A2. The second main surface 12, which is the top surface of the substrate 10, is processed. Thereafter, the rotary table 60 is rotated from the state shown in FIG. 13C into the state shown in FIG. 13B through the state shown in FIG. 13D and the state shown in FIG. 13A, and the substrate 10 is moved from the second position A2 to the first position A1 together with the second substrate chuck 62A.

Thereafter, the substrate 10 is transferred from the second substrate chuck 62A to the third transfer device 51 at the first position A1, and is taken out of the substrate processing apparatus 56.

Figure 14:
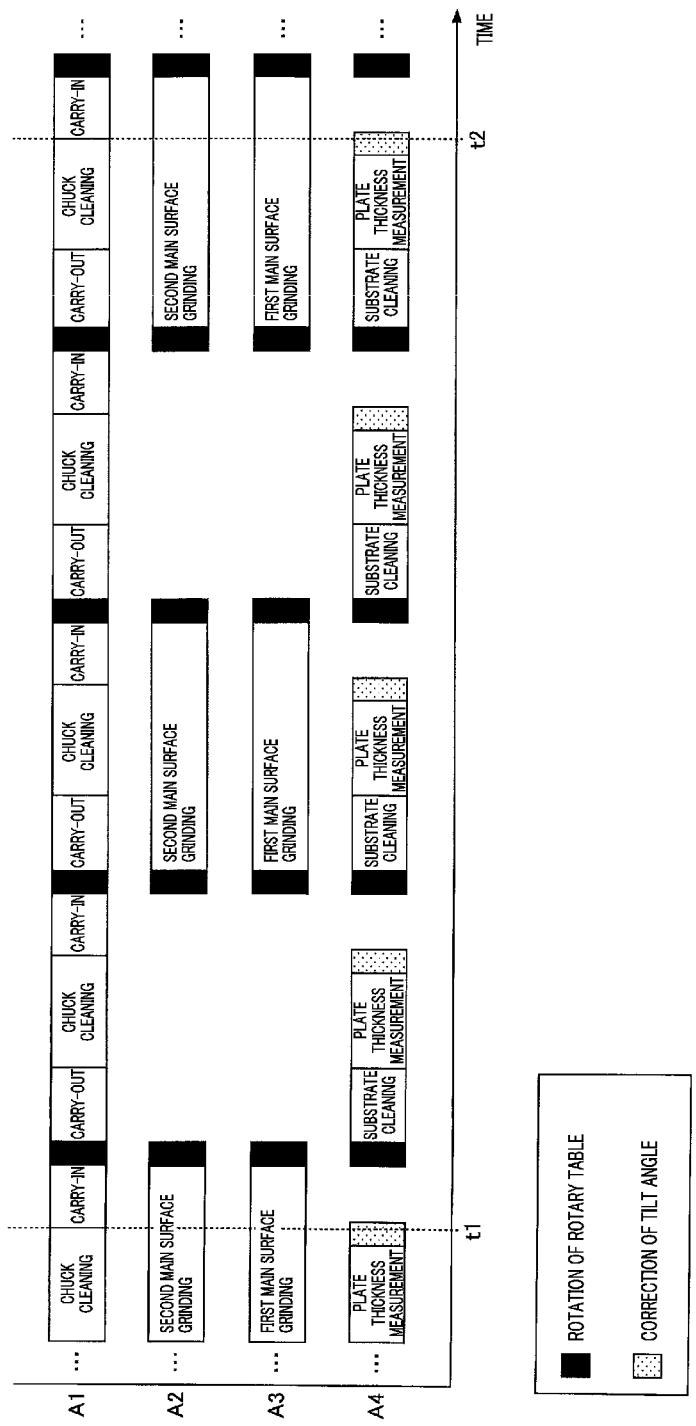
FIG. 14 is a timing chart illustrating processings performed at a first position, a second position, a third position, and a fourth position of FIG. 12.

Afterwards, processings performed at the first position A1, the second position A2, the third position A3 and the fourth position A4 will be described with reference to FIG. 14. At the first position A1, the carry-in/carry-out of the substrate 10 by the third transfer device 51 is performed, and, also, the attachment/detachment of the substrate 10 to/from the substrate chucks 61A, 61B, 62A and 62B is performed. Furthermore, at the first position A1, the cleaning of the substrate chucks 61A, 61B, 62A and 62B by the substrate chuck cleaning unit 77 is performed.

At the second position A2, the grinding of the second main surface 12 of the substrate 10 by the second processing unit 67 is performed. Further, although the correction of the tilt angle of the rotation axis R2 of the second substrate chuck 62A (62B) is performed at the fourth position A4 in FIG. 14, it may be performed at the second position A2. In the latter case, the correction of the tilt angle of the rotation axis R2 is performed before the grinding of the second main surface 12. Alternatively, the correction of the tilt angle of the rotation axis R2 of the second substrate chuck 62A (62B) may be performed during the rotation of the rotary table 60 from the first position A1 to the second position A2 after a new substrate 10 is carried in, for example.

At the third position A3, the grinding of the first main surface 11 of the substrate 10 by the first processing unit 63 is performed. Further, although the correction of the tilt angle of the rotation axis R2 of the first substrate chuck 61A (61B) is performed at the fourth position A4 in FIG. 14, it may be performed at the third position A3. In the latter case, the correction of the tilt angle of the rotation axis R2 may be performed before the grinding of the first main surface 11. Alternatively, the correction of the tilt angle of the rotation axis R2 of the first substrate chuck 61A and 61B may be performed during the rotation of the rotary table 60 from the first position A1 to the third position A3 after the new substrate 10 is carried in, for example.

At the fourth position A4, the attachment/detachment of the substrate and the processing of the substrate are not performed. At the fourth position A4, the cleaning of the substrate 10 by the substrate cleaning unit 76, the measurement of the plate thickness of the substrate 10 by the plate thickness distribution measuring unit 75, and the correction of the tilt angles by the first tilt angle correcting unit 95 and the second tilt angle correcting unit 96 are carried out.

Moreover, the correction of the tilt angle may be performed after the plate thickness of the substrate 10 is measured, and may be performed at the first position A1, the second position A2, or the third position A3 as stated above. However, if the plate thickness distribution measured by the plate thickness distribution measuring unit 75 falls within the tolerance range, the correction of the tilt angle is not performed.

Figure 15:
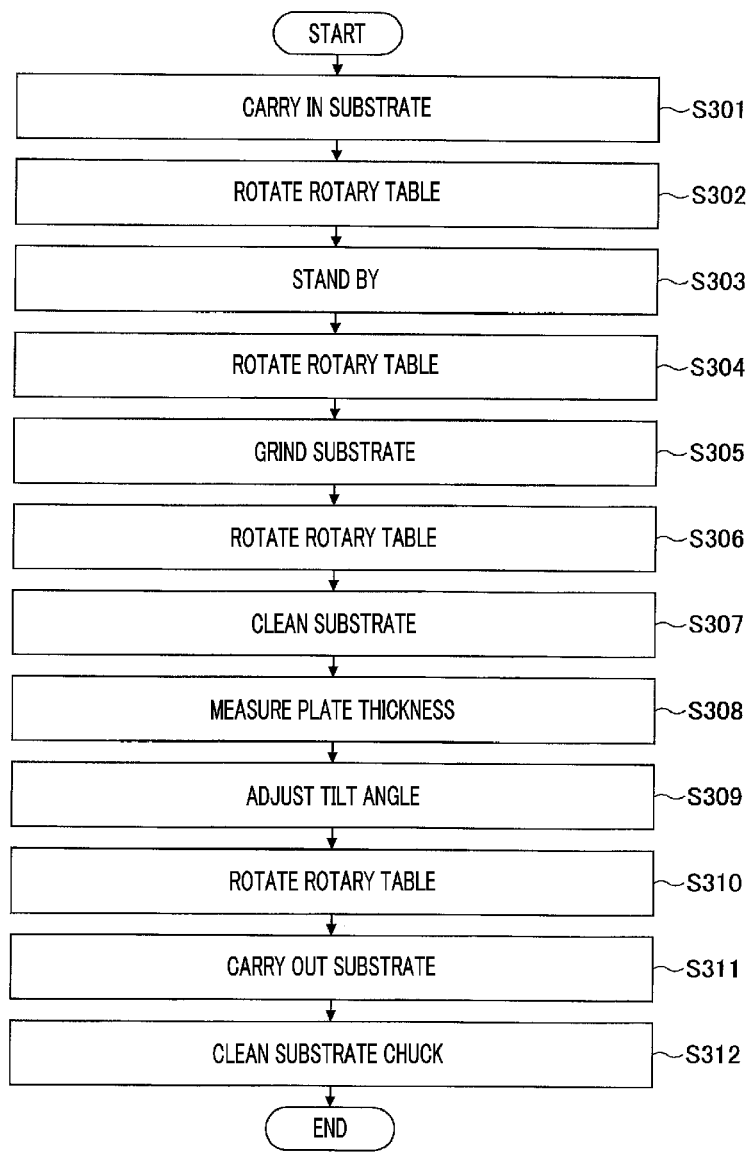
FIG. 15 is a flowchart illustrating processings performed by the first substrate chuck in a range from a time t1 and a time t2 of FIG. 14.

Finally, processings performed by using the first substrate chuck 61A in the range from the time t1 to the time t2 of FIG. 14 will be mainly described with reference to FIG. 15. At the time t1 of FIG. 14, the rotary table 60 is in the state of FIG. 13A. The processings shown in FIG. 15 are performed under the control of the control device 9. Further, processings performed at the first substrate chuck 61B and processings performed at the second substrate chucks 62A and 62B are the same as those shown in FIG. 15, and, thus, illustration thereof will be omitted.

First, the third transfer device 51 carries in the substrate 10 (S301), and the first substrate chuck 61A receives the substrate 10. In the meanwhile, the grinding of the second main surface 12 of the substrate 10 held by the second substrate chuck 62B is performed at the second position A2, as shown in FIG. 14. Further, at the third position A3, the grinding of the first main surface 11 of the substrate 10 held by the first substrate chuck 61B is performed. Also, at the fourth position A4, the correction of the tilt angle of the rotation axis R2 of the second substrate chuck 62A is performed.

Subsequently, the rotary table 60 is rotated by 90° from the state of FIG. 13A, as indicated by an arrow in FIG. 13A (S302). As a result, the rotary table 60 comes into the state of FIG. 13B. The first substrate chuck 61A is moved from the first position A1 to the second position A2; the second substrate chuck 62B is moved from the second position A2 to the third position A3; the first substrate chuck 61B is moved from the third position A3 to the fourth position A4; and the second substrate chuck 62A is moved from fourth position A4 to the first position A1.

Thereafter, the first substrate chuck 61A stands by at the second position A2 (S303). At the second position A2, since the top surface of the substrate 10 is the first main surface 11, the grinding of the second main surface 12 of the substrate 10 is not performed. Likewise, at the third position A3, since the top surface of the substrate 10 is the second main surface 12, the grinding of the first main surface 11 of the substrate 10 is not performed. In the meanwhile, at the first position A1, the carry-out of the substrate 10, the cleaning of the second substrate chuck 62A, and the carry-in of the new substrate 10 are performed, as shown in FIG. 14. Further, at the fourth position A4, the cleaning of the substrate 10, the measurement of the plate thickness of the substrate 10, and the correction of the tilt angle of the rotation axis R2 of the first substrate chuck 61B are performed.

Subsequently, the rotary table 60 is rotated by 90° from the state of FIG. 13B, as indicated by an arrow in FIG. 13B (S304). As a result, the rotary table 60 comes into the state of FIG. 13C. The first substrate chuck 61A is moved from the second position A2 to the third position A3; the second substrate chuck 62B is moved from the third position A3 to the fourth position A4; the first substrate chuck 61B is moved from the fourth position A4 to the first position A1; and the second substrate chuck 62A is moved from the first position A1 to the second position A2.

Afterwards, the first processing unit 63 grinds the first main surface 11 of the substrate 10 held by the first substrate chuck 61A (S305). This grinding is performed at the third position A3. In the meanwhile, at the first position A1, the carry-out of the substrate 10, the cleaning of the first substrate chuck 61B, and the carry-in of the next substrate 10 are performed, as shown in FIG. 14. Further, at the second position A2, the grinding of the second main surface 12 of the substrate 10 held by the second substrate chuck 62A is performed. In addition, at the fourth position A4, the cleaning of the substrate 10, the measurement of the plate thickness of the substrate 10, and the correction of the tilt angle of the rotation axis R2 of the second substrate chuck 62B are performed.

Figure 13C:
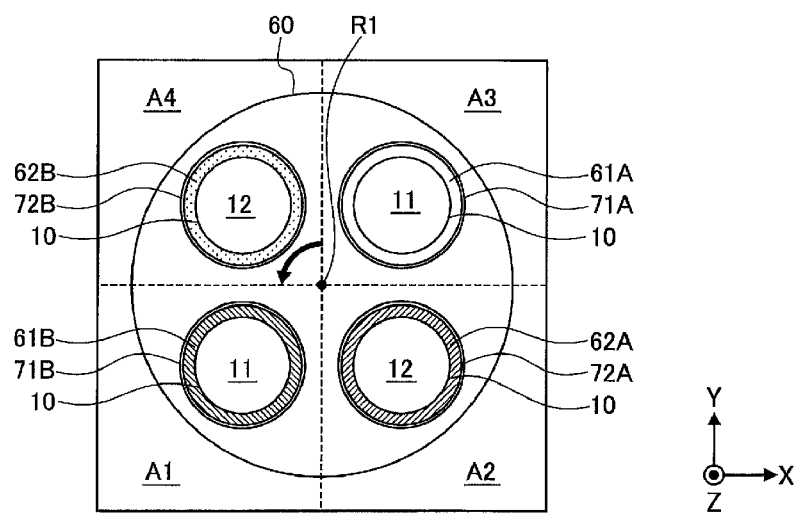
FIG. 13C is a plan view illustrating the rotational operation of the rotary table of FIG. 12 following that of FIG. 13B.

Subsequently, the rotary table 60 is rotated by 90° from the state of FIG. 13C, as indicated by an arrow in FIG. 13C (S306). As a result, the rotary table 60 comes into the state of FIG. 13D. The first substrate chuck 61A is moved from the third position A3 to the fourth position A4; the second substrate chuck 62B is moved from the fourth position A4 to the first position A1; the first substrate chuck 61B is moved from the first position A1 to the second position A2; and the second substrate chuck 62A is moved from the second position A2 to the third position A3.

Next, the substrate cleaning unit 76 cleans the substrate 10 held by the first substrate chuck 61A (S307), and the plate thickness distribution measuring unit 75 measures the plate thickness of the substrate 10 (S308). Then, the first tilt angle correcting unit 95 corrects the tilt angle of the rotation axis R2 of the first substrate chuck 61A (S309). The processes S307 to S309 are performed at the fourth position A4. In the meanwhile, at the first position A1, the carry-out of the substrate 10, the cleaning of the second substrate chuck 62B, and the carry-in of the substrate 10 are performed, as illustrated in FIG. 14. In addition, at the second position A2, since the top surface of the substrate 10 is the first main surface 11, the grinding of the second main surface 12 of the substrate 10 is not performed. Likewise, at the third position A3, since the top surface of the substrate 10 is the second main surface 12, the grinding of the first main surface 11 of the substrate 10 is not performed.

Figure 13D:
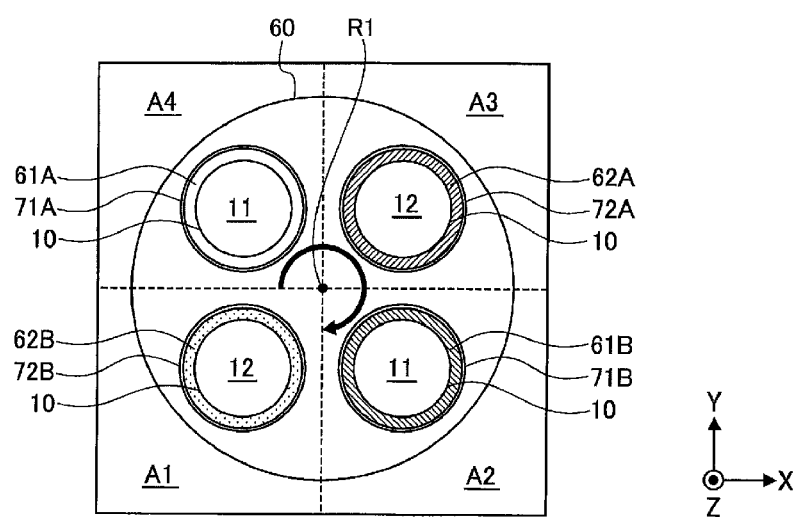
FIG. 13D is a plan view illustrating the rotational operation of the rotary table of FIG. 12 following that of FIG. 13C.

Then, the rotary table 60 is rotated by 270° from the state of FIG. 13D, as indicated by an arrow in FIG. 13D (S310). As a result, the rotary table 60 comes into the state of FIG. 13A. The first substrate chuck 61A is moved from the fourth position A4 to the first position A1; the second substrate chuck 62B is moved from the first position A1 to the second position A2; the first substrate chuck 61B is moved from the second position A2 to the third position A3; and the second substrate chuck 62A is moved from the third position A3 to the fourth position A4.

Subsequently, the third transfer device 51 receives the substrate 10 from the first substrate chuck 61A and carries it out (S311), and the substrate chuck cleaning unit 77 cleans the first substrate chuck 61A (S312). Then, the processings starting from the process S301 shown in FIG. 15 are performed again.

While the processes S311 to S312 and the process S301 are being performed at the first position A1, the following processings are performed at the second to fourth positions A2 to A4. At the second position A2, the grinding of the second main surface 12 of the substrate 10 held by the second substrate chuck 62B is performed. Further, at the third position A3, the grinding of the first main surface 11 of the substrate 10 held by the first substrate chuck 61B is performed. In addition, at the fourth position A4, the cleaning of the substrate 10, the measurement of the plate thickness of the substrate 10, and the correction of the tilt angle of the rotation axis R2 of the second substrate chuck 62A are performed.

In a normal operation mode, the grinding of the first main surface 11 and the grinding of the second main surface 12 are performed simultaneously, as stated above. However, at the beginning of a continuous operation mode or the like, only the grinding of the first main surface 11 is performed, and at the end of the continuous operation mode or the like, only the grinding of the second main surface 12 is performed. That is, although both the substrate 10 with the first main surface 11 facing upwards and the substrate 10 with the second main surface 12 facing upwards are disposed on the rotary table 60 in the normal operation mode, only the substrates 10 with the first main surfaces 11 thereof facing upwards are disposed on the rotary table 60 at the beginning of the continuous operation mode, or only the substrates 10 with the first main surfaces 12 thereof facing upwards are disposed on the rotary table 60 at the end of the continuous operation mode.

In the present modification example, the grinding of the second main surface 12 is performed at the second position A2, and the grinding of the first main surface 11 is performed at the third position A3. However, the grinding of the first main surface 11 may be performed at the second position A2, and the grinding of the second main surface 12 may be performed at the third position A3.

So far, the substrate processing apparatus, the substrate processing system and the substrate processing method according to the present disclosure have been described. However, it should be noted that the present disclosure is not limited to the above-described exemplary embodiment. Various changes, modifications, replacements, addition, deletion and combinations may be made within the scope of the claims, and all of these are included in the scope of the inventive concept of the present disclosure.

The substrate 10 is not limited to the silicon wafer. The substrate 10 may be, for example, a silicon carbide wafer, a gallium nitride wafer, a gallium oxide wafer, or the like. Furthermore, the substrate 10 may be a glass substrate.

The substrate processing system 1 according to the present exemplary embodiment is configured to grind both the first main surface 11 and the second main surface 12 of the single substrate 10. However, the substrate processing system 1 may be configured to grind only the first main surface 11 of one substrate 10 and only the second main surface 12 of another substrate 10. In the latter case, the first inverting device 34 and the second inverting device 54 may be omitted.

This application claims priority to Japanese Patent Application No. 2019-132256, field on Jul. 17, 2019, which application is hereby incorporated by reference in their entirety.

According to the exemplary embodiments, it is possible to perform both a processing of a first main surface of a substrate and a processing of a second main surface of the substrate opposite to the first main surface on a single rotary table.

We claim:

1. A substrate processing apparatus, comprising:
    a pair of first substrate chucks each configured to hold a substrate from below while allowing a first main surface of the substrate to face upwards;
    a pair of second substrate chucks each configured to hold the substrate from below while allowing a second main surface of the substrate opposite to the first main surface to face upwards;
    a rotary table which holds, around a vertical rotation axis thereof, a first one of the pair of first substrate chucks, a first one of the pair of second substrate chucks, a second one of the pair of first substrate chucks, and a second one of the pair of second substrate chucks in this sequence at a regular distance therebetween, and which is configured to be rotated about the rotation axis;
    a first processing unit equipped with a first processing tool configured to process the first main surface of the substrate held by the first substrate chuck; and
    a second processing unit equipped with a second processing tool configured to process the second main surface of the substrate held by the second substrate chuck.

2. The substrate processing apparatus of claim 1,
    wherein a first position at which attachment/detachment of the substrate to/from the first substrate chuck is performed, a second position at which a processing of the substrate by the second processing unit is performed, a third position at which a processing of the substrate by the first processing unit is performed, and a fourth position at which attachment/detachment of the substrate to/from the second substrate chuck is performed are arranged around the rotation axis of the rotary table in this order at a regular distance therebetween.

3. The substrate processing apparatus of claim 1,
    wherein a first position at which attachment/detachment of the substrate to/from the first substrate chuck and to/from the second substrate chuck is performed, a second position at which a processing of the substrate by the second processing unit is performed, a third position at which a processing of the substrate by the first processing unit is performed, and a fourth position at which neither the attachment/detachment of the substrate nor the processing of the substrate is performed are arranged around the rotation axis of the rotary table in this order at a regular distance therebetween.

4. The substrate processing apparatus of claim 1,
wherein the first substrate chuck and the second substrate chuck are held by the rotary table so as to be rotated around respective rotation axes thereof, and
wherein the substrate processing apparatus comprises:
a first tilt angle adjusting unit configured to adjust a tilt angle of the rotation axis of the first substrate chuck; and
a second tilt angle adjusting unit configured to adjust a tilt angle of the rotation axis of the second substrate chuck.

5. The substrate processing apparatus of claim 4,
wherein the first substrate chuck includes a conical substrate holding surface processed by the first processing unit, and
the second substrate chuck includes a conical substrate holding surface processed by the second processing unit.

6. The substrate processing apparatus of claim 4, further comprising:
a first tilt angle correcting unit configured to correct the tilt angle of the rotation axis of the first substrate chuck based on a plate thickness distribution in a diametrical direction of the substrate processed by the first processing unit; and
a second tilt angle correcting unit configured to correct the tilt angle of the rotation axis of the second substrate chuck based on a plate thickness distribution in the diametrical direction of the substrate processed by the second processing unit.

7. The substrate processing apparatus of claim 6,
wherein a first position at which attachment/detachment of the substrate to/from the first substrate chuck and measurement of a plate thickness of the substrate processed by the first processing unit are performed, a second position at which a processing of the substrate by the second processing unit is performed, a third position at which a processing of the substrate by the first processing unit is performed, and a fourth position at which attachment/detachment of the substrate to/from the second substrate chuck and measurement of a plate thickness of the substrate processed by the second processing unit are performed are arranged around the rotation axis of the rotary table in this order at a regular distance therebetween.

8. The substrate processing apparatus of claim 6,
wherein a first position at which attachment/detachment of the substrate to/from the first substrate chuck and to/from the second substrate chuck is performed, a second position at which a processing of the substrate by the second processing unit is performed, a third position at which a processing of the substrate by the first processing unit is performed, and a fourth position at which measurement of a plate thickness of the substrate processed by the first processing unit and measurement of a plate thickness of the substrate processed by the second processing unit are performed are arranged around the rotation axis of the rotary table in this order at a regular distance therebetween.

9. A substrate processing system, comprising:
a substrate processing apparatus as claimed in claim 1;
a cleaning apparatus configured to clean the substrate taken out from the substrate processing apparatus after the processing by the first processing unit and before the processing by the second processing unit; and
a buffer device configured to store therein the substrate after being cleaned by the cleaning apparatus and before being returned back into the substrate processing apparatus.

10. The substrate processing system of claim 9, further comprising:
an inverting device configured to invert the substrate cleaned by the cleaning apparatus upside down; and
an alignment device configured to detect a center of the substrate inverted upside down by the inverting device,
wherein the buffer device is provided at a portion of a transfer path of the substrate which is transferred from the cleaning apparatus to the alignment device via the inverting device.

11. A substrate processing method, comprising:
rotating a rotary table around a vertical rotation axis thereof, the rotary table holding a pair of first substrate chucks and a pair of second substrate chucks at a regular distance therebetween around the rotation axis thereof;
holding a substrate from below with each of the pair of first substrate chucks symmetrically arranged with respect to the rotation axis, while allowing a first main surface of the substrate to face upwards;
processing the first main surface of the substrate held by the first substrate chuck with a first processing unit;
holding the substrate from below with each of the pair of second substrate chucks symmetrically arranged with respect to the rotation axis, while allowing a second main surface of the substrate opposite to the first main surface to face upwards; and
processing the second main surface of the substrate held by the second substrate chuck with a second processing unit.

12. The substrate processing method of claim 11,
wherein a first position at which attachment/detachment of the substrate to/from the first substrate chuck is performed, a second position at which a processing of the substrate by the second processing unit is performed, a third position at which a processing of the substrate by the first processing unit is performed, and a fourth position at which attachment/detachment of the substrate to/from the second substrate chuck is performed are arranged around the rotation axis of the rotary table in this order at a regular distance therebetween, and
the substrate processing method comprises moving each of the pair of first substrate chucks to the first position and the third position alternately, and moving each of the pair of second substrate chucks to the second position and the fourth position alternately by rotating the rotary table.

13. The substrate processing method of claim 11,
wherein a first position at which attachment/detachment of the substrate to/from the first substrate chucks and to/from the second substrate chuck is performed, a second position at which a processing of the substrate by the second processing unit is performed, a third position at which a processing of the substrate by the first processing unit is performed, and a fourth position at which neither the attachment/detachment of the substrate nor the processing of the substrate is performed are arranged around the rotation axis of the rotary table in this order at a regular distance therebetween, and the substrate processing method comprises moving each of the pair of first substrate chucks and each of the pair of second substrate chucks to the first position, the second position, the third position and the fourth position in this order, and returning each of the pair of first substrate chucks and each of the pair of second substrate chucks to the first position from the fourth position by rotating the rotary table.

14. The substrate processing method of claim 11,
wherein the pair of the first substrate chucks and the pair of the second substrate chucks are held by the rotary table so as to be rotated around respective rotation axes thereof, and the substrate processing method comprises adjusting a tilt angle of the rotation axis of the first substrate chuck, and adjusting a tilt angle of the rotation axis of the second substrate chuck.

15. The substrate processing method of claim 14, further comprising:
holding the substrate from below on a conical substrate holding surface of the first substrate chuck processed by the first processing unit, and holding the substrate from below on a conical substrate holding surface of the second substrate chuck processed by the second processing unit.

16. The substrate processing method of claim 14, further comprising:
correcting the tilt angle of the rotation axis of the first substrate chuck based on a plate thickness distribution in a diametrical direction of the substrate processed by the first processing unit; and correcting the tilt angle of the rotation axis of the second substrate chuck based on a plate thickness distribution in the diametrical direction of the substrate processed by the second processing unit.

17. The substrate processing method of claim 11, further comprising:
cleaning the substrate detached from the first substrate chuck after the processing by the first processing unit and before the processing by the second processing unit; and storing the cleaned substrate in a buffer device before being attached to the second substrate chuck.

18. The substrate processing method of claim 17, further comprising:
inverting the cleaned substrate upside down; and detecting a center of the substrate inverted upside down, wherein the storing of the cleaned substrate in the buffer device is performed before the detecting of the center of the substrate inverted upside down.

\* \* \* \* \*